United States Patent
Katrak et al.

(10) Patent No.: US 10,222,429 B2
(45) Date of Patent: Mar. 5, 2019

(54) DIAGNOSTIC SYSTEM FOR A DC-DC VOLTAGE CONVERTER

(71) Applicant: LG Chem, Ltd., Seoul (KR)

(72) Inventors: Kerfegar K. Katrak, Fenton, MI (US); Mehdi Rexha, Sterling Heights, MI (US); Kunal Tipnis, Troy, MI (US)

(73) Assignee: LG Chem, Ltd., Seoul (KR)

( * ) Notice: Subject to any disclaimer, the term of this patent is extended or adjusted under 35 U.S.C. 154(b) by 264 days.

(21) Appl. No.: 15/246,887

(22) Filed: Aug. 25, 2016

(65) Prior Publication Data

US 2017/0363691 A1  Dec. 21, 2017

Related U.S. Application Data

(60) Provisional application No. 62/352,251, filed on Jun. 20, 2016.

(51) Int. Cl.
| | |
|---|---|
| *H02M 1/32* | (2007.01) |
| *H02M 3/156* | (2006.01) |
| *H03M 1/12* | (2006.01) |
| *G01R 31/40* | (2014.01) |
| *G01R 19/165* | (2006.01) |

(52) U.S. Cl.
CPC ........... *G01R 31/40* (2013.01); *G01R 19/165* (2013.01); *H02M 1/32* (2013.01); *H02M 3/156* (2013.01); *H03M 1/12* (2013.01)

(58) Field of Classification Search
None
See application file for complete search history.

(56) References Cited

U.S. PATENT DOCUMENTS

| | | | |
|---|---|---|---|
| 5,945,935 A | * | 8/1999 | Kusumoto ............ H03M 1/206 341/159 |
| 6,741,436 B2 | | 5/2004 | Gilbert et al. |
| 8,385,030 B2 | | 2/2013 | Maher |
| 9,964,599 B2 | * | 5/2018 | Katrak ................... G01R 31/40 |
| 2015/0365003 A1 | * | 12/2015 | Sadwick ................ H02M 3/28 363/21.01 |

(Continued)

OTHER PUBLICATIONS

Jamshidpour, Ehsan et al., Single-Switch DC-DC Converter With Fault-Tolerant.*

(Continued)

*Primary Examiner* — Roy Y Yi
(74) *Attorney, Agent, or Firm* — Buckert Patent & Trademark Law Firm PC; John F. Buckert

(57) ABSTRACT

A diagnostic system for a DC-DC voltage converter is provided. The DC-DC voltage converter has a high voltage bi-directional MOSFET switch. The high voltage bi-directional MOSFET switch has a first node and a second node. The microcontroller samples a first voltage at the first node at a first sampling rate utilizing a first common channel in a first bank of channels to obtain a first predetermined number of voltage samples. The microcontroller determines a first number of voltage samples in the first predetermined number of voltage samples in which the first voltage is less than a first threshold voltage. The microcontroller sets a first voltage diagnostic flag equal to a first fault value if the first number of voltage samples is greater than a first threshold number of voltage samples indicating a voltage out of range low fault condition for the analog-to-digital converter.

12 Claims, 21 Drawing Sheets

(56) References Cited

U.S. PATENT DOCUMENTS

2015/0372606 A1* 12/2015 Tamura ............ H02M 3/33584
363/21.04

OTHER PUBLICATIONS

Capability Under Open- and Short-Circuit Switch Failures IEEE Transactions on Power Electronics, vol. 30, No. 5, May 2015.*
Poon, Jason, Model-Based Fault Detection and Identification for Power Electronic Systems, Dec. 2015.*
AN0021: Analog to Digital Converter (ADC), Silicon labs Rev 1.11.*
U.S. Appl. No. 15/247,087, filed Aug. 25, 2016 entitled Diagnostic System for a DC-DC Voltage Converter.

* cited by examiner

DIAGNOSTIC SYSTEM FOR A DC-DC VOLTAGE CONVERTER

CROSS-REFERENCE TO RELATED APPLICATION

This application claims priority to U.S. Provisional Patent Application No. 62/352,251 filed on Jun. 20, 2016, the entire contents of which are hereby incorporated by reference herein.

BACKGROUND

The inventors herein have recognized a need for an improved diagnostic system for a DC-DC voltage converter. The diagnostic system provides a technical effect of obtaining diagnostic diversity by sampling a first voltage at a first node of a high voltage bi-directional MOSFET switch in the DC-DC voltage converter using a common channel in a first bank of channels of an analog-to-digital converter, and then sampling the first voltage using the common channel in a second bank of channels of the analog-to-digital converter to determine fault conditions associated with the high voltage bi-directional MOSFET switch.

SUMMARY

A diagnostic system for a DC-DC voltage converter in accordance with an exemplary embodiment is provided. The DC-DC voltage converter has a high voltage bi-directional MOSFET switch. The high voltage bi-directional MOSFET switch has a first node and a second node. A first voltage is applied to the first node, and a second voltage is output at the second node. The diagnostic system includes a microcontroller having an analog-to-digital converter. The analog-to-digital converter has a first bank of channels and a second bank of channels. The first bank of channels includes first and second common channels and at least first and second non-common channels. The second bank of channels includes the first and second common channels and at least third and fourth non-common channels. The first common channel being electrically coupled to the first node of the high voltage bi-directional MOSFET switch for receiving the first voltage. The microcontroller is programmed to sample the first voltage at a first sampling rate utilizing the first common channel in the first bank of channels to obtain a first predetermined number of voltage samples. The microcontroller is further programmed to determine a first number of voltage samples in the first predetermined number of voltage samples in which the first voltage is less than a first threshold voltage. The microcontroller is further programmed to set a first voltage diagnostic flag equal to a first fault value if the first number of voltage samples is greater than a first threshold number of voltage samples indicating a voltage out of range low fault condition for the analog-to-digital converter. The microcontroller is programmed to sample the first voltage at the first sampling rate utilizing the first common channel in the second bank of channels to obtain a second predetermined number of voltage samples. The microcontroller is further programmed to determine a second number of voltage samples in the second predetermined number of voltage samples in which the first voltage is less than the first threshold voltage. The microcontroller is further programmed to set a second voltage diagnostic flag equal to a second first fault value if the second number of voltage samples is greater than the first threshold number of voltage samples indicating the voltage out of range low fault condition for the analog-to-digital converter.

A diagnostic system for a DC-DC voltage converter in accordance with another exemplary embodiment is provided. The DC-DC voltage converter has a high voltage bi-directional MOSFET switch. The high voltage bi-directional MOSFET switch has a first node and a second node. A first voltage is applied to the first node, and a second voltage is output at the second node. The diagnostic system includes a microcontroller having an analog-to-digital converter. The analog-to-digital converter has a first bank of channels and a second bank of channels. The first bank of channels includes first and second common channels and at least first and second non-common channels. The second bank of channels include the first and second common channels and at least third and fourth non-common channels. The first common channel is electrically coupled to the first node of the high voltage bi-directional MOSFET switch for receiving the first voltage. The microcontroller is programmed to sample the first voltage at a first sampling rate utilizing the first common channel in the first bank of channels to obtain a first predetermined number of voltage samples. The microcontroller is further programmed to determine a first number of voltage samples in the first predetermined number of voltage samples in which the first voltage is greater than a first threshold voltage. The microcontroller is further programmed to set a first voltage diagnostic flag equal to a first fault value if the first number of voltage samples is greater than a first threshold number of voltage samples indicating a voltage out of range high fault condition for the analog-to-digital converter. The microcontroller is further programmed to sample the first voltage at the first sampling rate utilizing the first common channel in the second bank of channels to obtain a second predetermined number of voltage samples. The microcontroller is further programmed to determine a second number of voltage samples in the second predetermined number of voltage samples in which the first voltage is greater than the first threshold voltage. The microcontroller is further programmed to set a second voltage diagnostic flag equal to a second first fault value if the second number of voltage samples is greater than the first threshold number of voltage samples indicating the voltage out of range high fault condition for the analog-to-digital converter.

A diagnostic system for a DC-DC voltage converter in accordance with another exemplary embodiment is provided. The DC-DC voltage converter has a high voltage bi-directional MOSFET switch. The high voltage bi-directional MOSFET switch has a first node and a second node. A first voltage is applied to the first node, and a second voltage is output at the second node. The diagnostic system includes a microcontroller having an analog-to-digital converter. The analog-to-digital converter has a first bank of channels and a second bank of channels. The first bank of channels include first and second common channels and at least first and second non-common channels. The second bank of channels include the first and second common channels and at least third and fourth non-common channels. The first common channel is electrically coupled to the first node of the high voltage bi-directional MOSFET switch for receiving the first voltage. The first non-common channel of the first bank of channels is electrically coupled to the second node of the high voltage bi-directional MOSFET switch for receiving the second voltage. The microcontroller is programmed to sample the first voltage at a first sampling rate utilizing the first common channel in the first bank of channels to obtain a first predetermined number of voltage samples. The microcontroller is further programmed to calculate a first average voltage value corresponding to an average value of the first predetermined number of voltage samples. The microcontroller is further programmed to sample the second voltage at the first sampling rate utilizing the first non-common channel in the first bank of channels to obtain a second predetermined number of voltage samples. The microcontroller is further programmed to calculate a second average voltage value corresponding to an average value of the second predetermined number of voltage samples. The microcontroller is further programmed to calculate a first voltage difference value corresponding to an absolute value of a difference between the first average voltage value and the second average voltage value. The microcontroller is further programmed to stop generating a control signal to induce the low voltage bi-directional MOSFET switch to transition to an open operational state if the first voltage difference value is greater than a first threshold voltage difference value.

A diagnostic system for a DC-DC voltage converter in accordance with another exemplary embodiment is provided. The DC-DC voltage converter has a high voltage bi-directional MOSFET switch. The high voltage bi-directional MOSFET switch has a first node and a second node. A first voltage is applied to the first node, and a second voltage is output at the second node. The diagnostic system includes a microcontroller having an analog-to-digital converter. The analog-to-digital converter has a first bank of channels and a second bank of channels. The first bank of channels includes first and second common channels and at least first and second non-common channels. The second bank of channels includes the first and second common channels and at least third and fourth non-common channels. The first common channel is electrically coupled to the first node of the high voltage bi-directional MOSFET switch for receiving the first voltage. The first non-common channel of the first bank of channels is electrically coupled to the second node of the high voltage bi-directional MOSFET switch for receiving the second voltage. The microcontroller is programmed to sample the first voltage at a first sampling rate utilizing the first common channel in the second bank of channels to obtain a first predetermined number of voltage samples. The microcontroller is further programmed to calculate a first average voltage value corresponding to an average value of the first predetermined number of voltage samples. The microcontroller is further programmed to sample the second voltage at the first sampling rate utilizing the first non-common channel in the first bank of channels to obtain a second predetermined number of voltage samples. The microcontroller is further programmed to calculate a second average voltage value corresponding to an average value of the second predetermined number of voltage samples. The microcontroller is further programmed to calculate a first voltage difference value corresponding to an absolute value of a difference between the first average voltage value and the second average voltage value. The microcontroller is further programmed to stop generating a control signal to induce the low voltage bi-directional MOSFET switch to transition to an open operational state if the first voltage difference value is greater than a first threshold voltage difference value.

A diagnostic system for a DC-DC voltage converter in accordance with another exemplary embodiment is provided. The DC-DC voltage converter has a high voltage bi-directional MOSFET switch. The high voltage bi-directional MOSFET switch has a first node and a second node. A first voltage is applied to the first node, and a second voltage is output at the second node. The diagnostic system includes a microcontroller having an analog-to-digital converter. The analog-to-digital converter has a first bank of channels and a second bank of channels. The first bank of channels includes first and second common channels and at least first and second non-common channels. The second bank of channels includes the first and second common channels and at least third and fourth non-common channels. The first common channel is electrically coupled to the first node of the high voltage bi-directional MOSFET switch for receiving the first voltage. The first non-common channel of the first bank of channels is electrically coupled to the second node of the high voltage bi-directional MOSFET switch for receiving the second voltage. The microcontroller is programmed to sample the first voltage at a first sampling rate utilizing the second common channel in the first bank of channels to obtain a first predetermined number of voltage samples. The microcontroller is further programmed to calculate a first average voltage value corresponding to an average value of the first predetermined number of voltage samples. The microcontroller is further programmed to sample the second voltage at the first sampling rate utilizing the first non-common channel in the first bank of channels to obtain a second predetermined number of voltage samples. The microcontroller is further programmed to calculate a second average voltage value corresponding to an average value of the second predetermined number of voltage samples. The microcontroller is further programmed to calculate a first voltage difference value corresponding to an absolute value of a difference between the first average voltage value and the second average voltage value. The microcontroller is further programmed to stop generating a control signal to induce the low voltage bi-directional MOSFET switch to transition to an open operational state if the first voltage difference value is greater than a first threshold voltage difference value.

DETAILED DESCRIPTION

Figure 1:
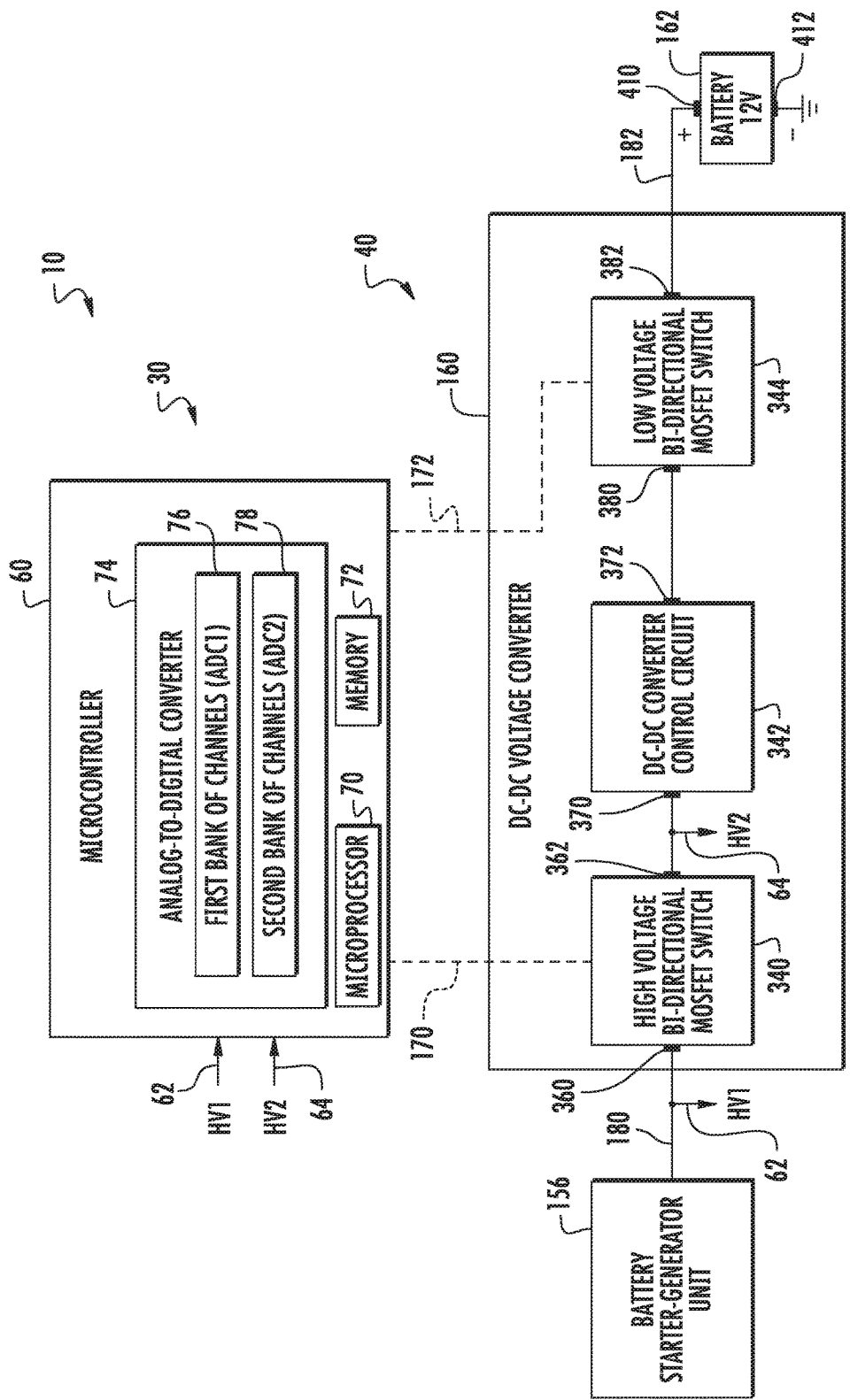
FIG. 1 is a schematic of a vehicle having a diagnostic system for a DC-DC voltage converter in accordance with an exemplary embodiment, and a control circuit.

Referring to FIG. 1, a vehicle 10 includes a diagnostic system 30 for a DC-DC voltage converter 160 in accordance with an exemplary embodiment, and a control circuit 40. An advantage of the diagnostic system 30 is that the system 30 obtains diagnostic diversity by sampling (measuring) a first voltage at a first node of a high voltage bi-directional MOSFET switch 340 using a common channel 94 (shown in FIG. 2) in a first bank of channels 76 of an analog-to-digital converter 160, and then sampling the first voltage using the common channel 94 in a second bank of channels 78 of the analog-to-digital converter 160 to determine fault conditions associated with the high voltage bi-directional MOSFET switch 340.

For purposes of understanding a node is a region or a location in an electrical circuit.

The diagnostic system 30 is provided to perform diagnostic tests on the DC-DC voltage converter 160, which will be described in greater detail below. The diagnostic system 30 includes the microcontroller 60 and electrical sense lines 62, 64.

The microcontroller 60 includes a microprocessor 70, a memory 72, and the analog-to-digital converter 74. The microcontroller 60 is programmed to perform diagnostic steps in a flowchart described herein utilizing the microprocessor 70 which executes software instructions stored in the memory 72. The microprocessor 70 operably communicates with the analog-to-digital converter 74 and the memory 72.

Figure 2:
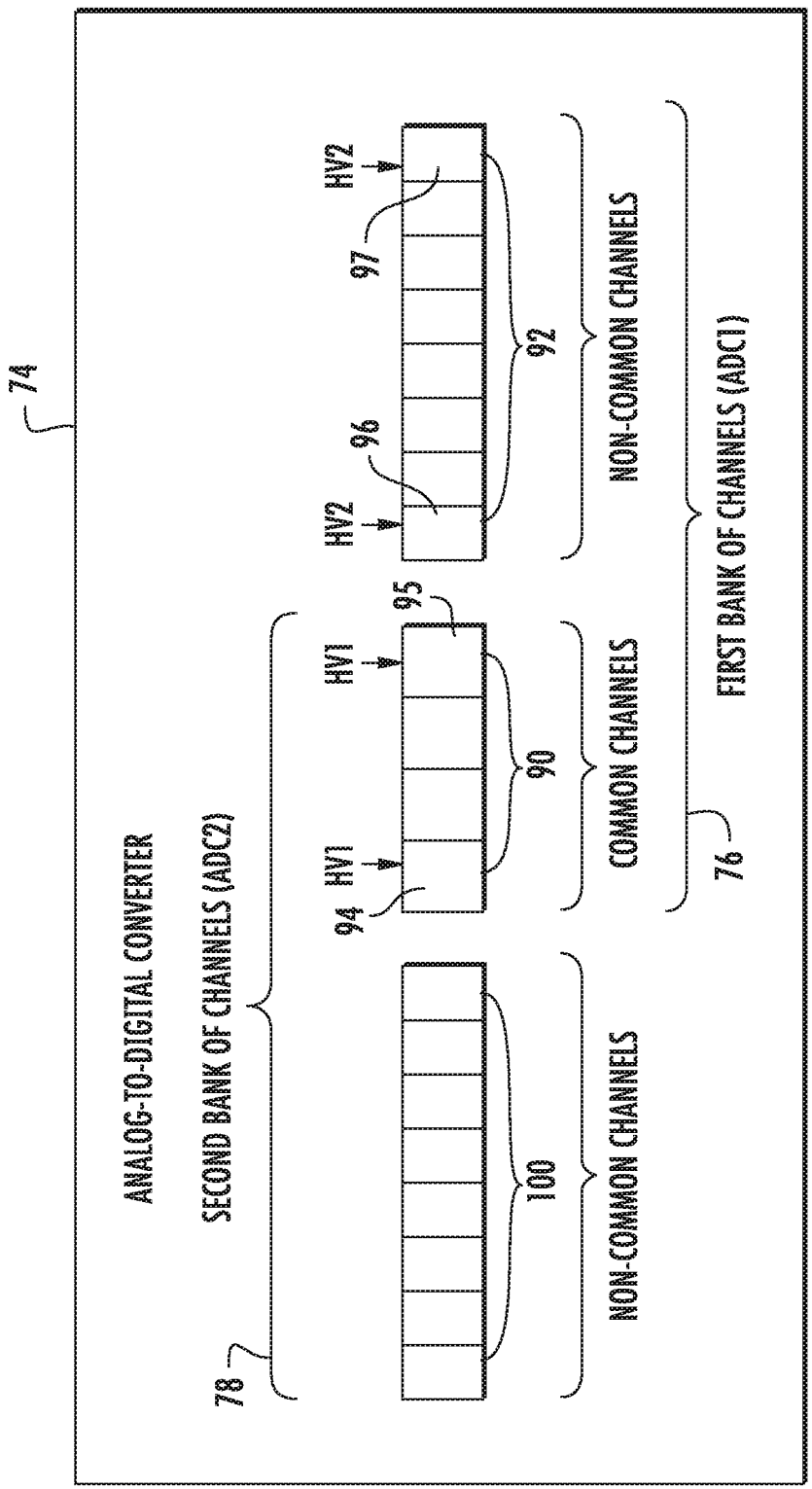
FIG. 2 is a schematic of an analog-to-digital converter utilized in a microcontroller in the diagnostic system of FIG. 1.

Referring to FIGS. 1 and 2, the analog-to-digital converter 74 includes a first bank of channels 76 (also referred to as ADC1 herein) and a second bank of channels 78 (also referred to as ADC2 herein). The first bank of channels 76 includes common channels 90 (shown in FIG. 2) and non-common channels 92, which collectively comprise twelve channels in an exemplary embodiment. The common channels 90 include a common channel 94 and a common channel 95. The non-common channels 92 include a non-common channel 96 and a non-common channel 97. The second bank of channels 78 includes the common channels 90 and non-common channels 100, which collectively comprise twelve channels in an exemplary embodiment. Thus, both the first and second bank of channels 76, 78 share the common channels 90 including the common channel 94 and the common channel 95.

When the microcontroller 60 utilizes the first bank of channels 76 to sample voltages, the common channels 90 and the non-common channels 92 sample their respective input voltages and generate voltage values corresponding to their respective input voltages. Further, when the microcontroller 60 utilizes the second bank of channels 76 to sample voltages, the common channels 90 and the non-common channels 100 sample their respective input voltages and generate voltage values corresponding to their respective input voltages.

The electrical sense line 62 is electrically coupled to and between the first node 360 of the high voltage bi-directional MOSFET switch 340 and the common channel 94 of the analog-to-digital converter 74. Further, the electrical sense line 62 is electrically coupled to and between the first node 360 of the high voltage bi-directional MOSFET switch 340 and the common channel 95 of the analog-to-digital converter 74.

The electrical sense line 64 is electrically coupled to and between the second node 362 of the high voltage bi-directional MOSFET switch 340 and the non-common channel 96 of the analog-to-digital converter 74. Further, the electrical sense line 64 is electrically coupled to and between the second node 362 of the high voltage bi-directional MOSFET switch 340 and the non-common channel 97 of the analog-to-digital converter 74.

The common channels 94, 95 of the analog to digital converter 74 of the microcontroller 60 are utilized to sample the first voltage (HV1) applied to the high voltage bi-directional MOSFET switch 340 for performing diagnostic tests on the high voltage bi-directional MOSFET switch 340, as will be described in greater detail below.

Further, the non-common channels 96, 97 of the analog to digital converter 74 of the microcontroller 60 are utilized to sample the second voltage (HV2) output by the high voltage bi-directional MOSFET switch 340 for performing diagnostic tests on the high voltage bi-directional MOSFET switch 340, as will be described in greater detail below.

Referring to FIG. 1, the control circuit 40 includes the microcontroller 60, a battery-starter generator unit 156, the DC-DC voltage converter 160, a battery 162, and electrical lines 170, 172, 180, 182.

The DC-DC voltage converter 160 is provided to receive a first voltage level from the battery-starter generator unit 156 and to output a second voltage level (e.g., 12 Vdc) to the battery 162. The DC-DC voltage converter 160 includes the high voltage bi-directional MOSFET switch 340, a DC-DC control circuit 342, and a low voltage bi-directional MOSFET switch 344.

Figure 3:
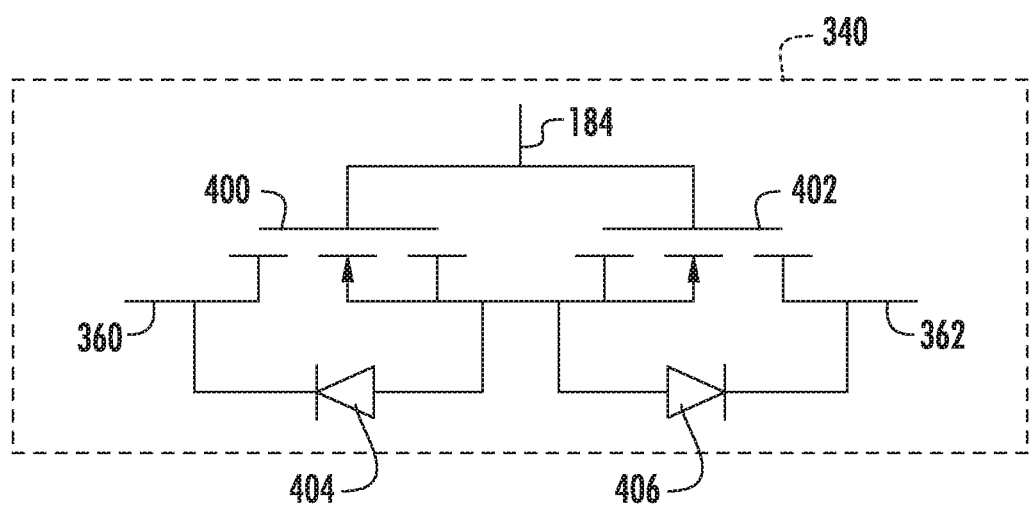
FIG. 3 is a schematic of a bi-directional MOSFET switch utilized in the DC-DC voltage converter of FIG. 1.
Figure 4:
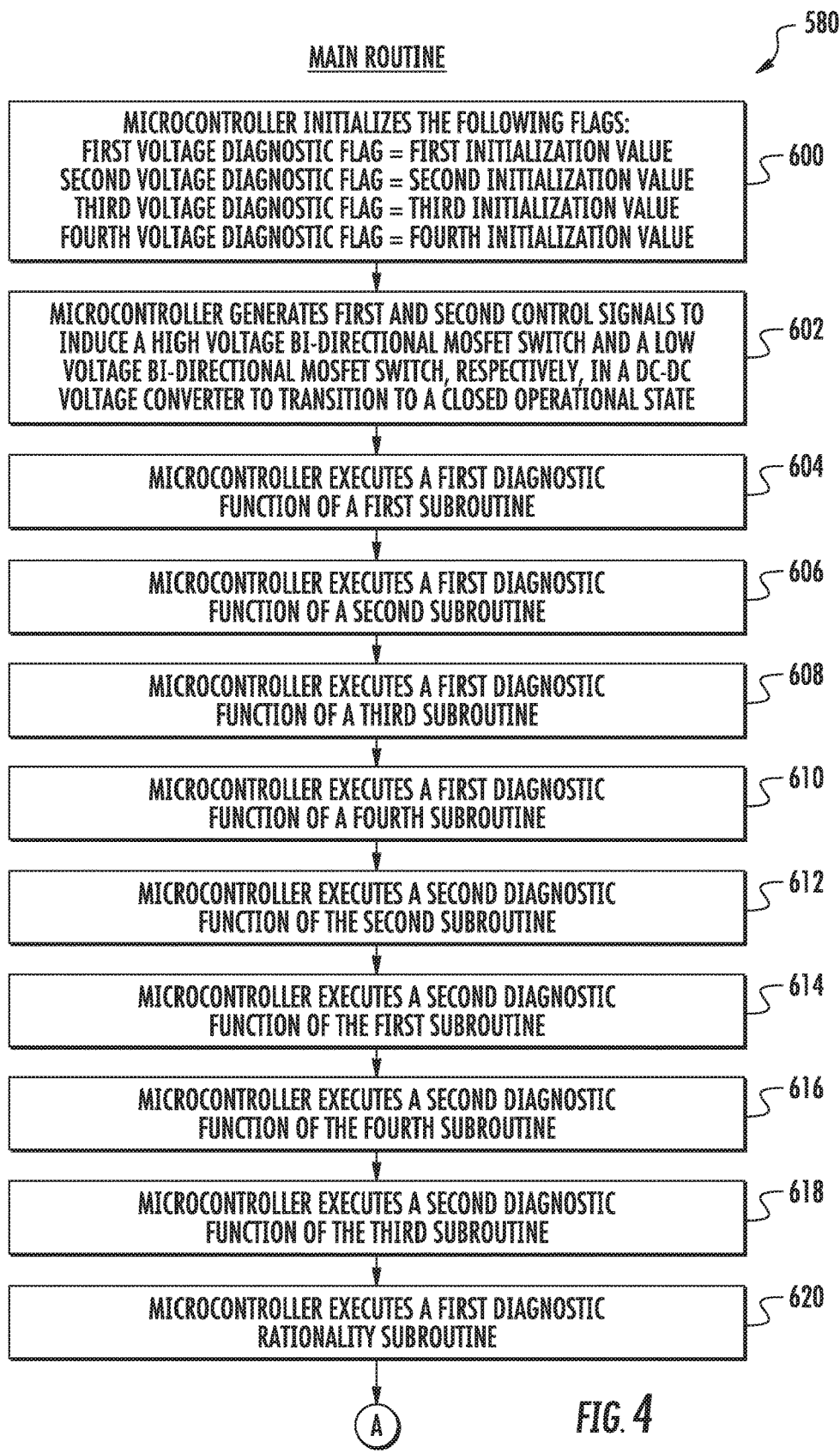
FIGS. 4-21 are flowcharts of a method for performing diagnostic tests on the DC-DC voltage converter of FIG. 1.
Figure 5:
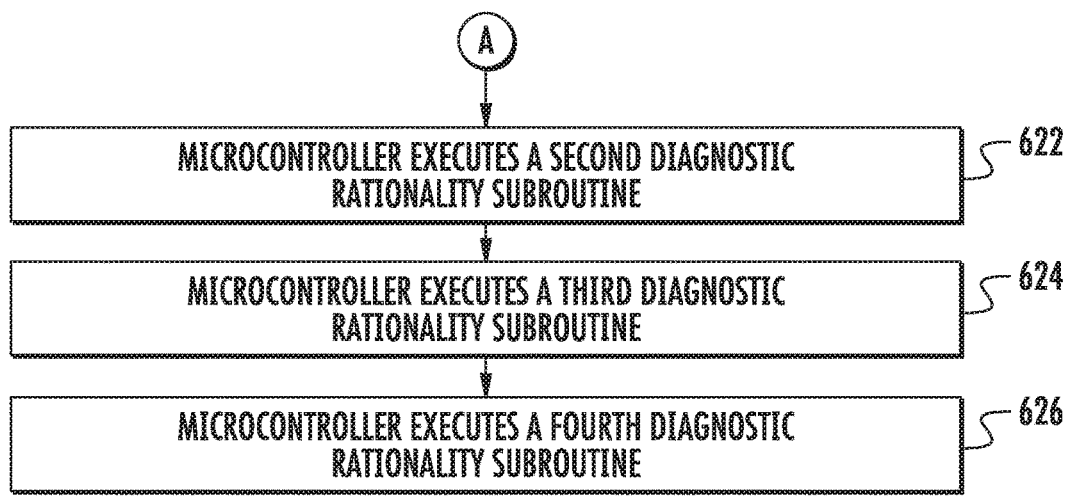

Referring to FIGS. 1 and 3, the high voltage bi-directional MOSFET switch 340 includes a first node 360 (e.g., an input node) and a second node 362 (e.g., an output node). The first node 360 is electrically coupled to the battery-starter generator unit 156 utilizing the electrical line 180. The second node 362 is electrically coupled to a first node 370 of the DC-DC control circuit 342. In an exemplary embodiment, the high voltage bi-directional MOSFET switch 340 includes MOSFETs 400, 402 and diodes 404, 406 as illustrated in FIG. 3. Of course, in an alternative embodiment, the high voltage bi-directional MOSFET switch 340 could be replaced with another type of bi-directional switch having desired voltage and current capabilities. When the microcontroller 60 generates a first control signal that is received by the high voltage bi-directional MOSFET switch 340 (or that is received by a controller or a microprocessor within the DC-DC voltage converter 160 that is operably coupled to the switch 340) via the electrical line 170, the switch 340 transitions to a closed operational state. When the microcontroller 60 stops generating the first control signal, the switch 340 transitions to an open operational state.

The DC-DC control circuit 342 has a first node 370 (e.g., an input node) and a second node 372 (e.g., an output node). The first node 370 is electrically coupled to the second node 362 of the high voltage bi-directional MOSFET switch 340. The second node 372 is electrically coupled to the first node 380 of the low voltage bi-directional MOSFET switch 344.

The low voltage bi-directional MOSFET switch 344 includes a first node 380 (e.g., an input node) and a second node 382 (e.g., an output node). The first node 380 is electrically coupled to the second node 372 of the DC-DC control circuit 342. The second node 382 is electrically coupled to the battery 162 utilizing the electrical line 182. In an exemplary embodiment, the low voltage bi-directional MOSFET switch 344 has an identical structure as the high voltage bi-directional MOSFET switch 340 illustrated in FIG. 3. Of course, in an alternative embodiment, the low voltage bi-directional MOSFET switch 344 could be replaced with another type of bi-directional switch having desired voltage and current capabilities. When the microcontroller 60 generates a second control signal that is received by the low voltage bi-directional MOSFET switch 344 (or that is received by a controller or a microprocessor within the DC-DC voltage converter 160 that is operably coupled to the switch 344) via the electrical line 172, the switch 344 transitions to a closed operational state. When the microcontroller 60 stops generating the second control signal, the switch 344 transitions to an open operational state.

The battery 162 includes a positive terminal 410 and a negative terminal 412. In an exemplary embodiment, the battery 162 generates 12 Vdc between the positive terminal 410 and the negative terminal 412.

Referring to FIGS. 1, 2 and 4-21, a flowchart of a method for performing diagnostic tests on the DC-DC voltage converter 160 and for implementing control steps based on the results of the diagnostic tests, will now be explained.

The microcontroller 60 executes a main routine or program 580 (shown in FIGS. 4 and 5) which calls functions of other subroutines for performing the diagnostic tests and for implementing control steps based on the results of the diagnostic test. The main routine 580 will now be described.

At step 600, the microcontroller 60 initializes the following flags:
first voltage diagnostic flag=first initialization value
second voltage diagnostic flag=second initialization value
third voltage diagnostic flag=third initialization value
fourth voltage diagnostic flag=fourth initialization value.
After step 600, the method advances to step 602.

At step 602, the microcontroller 60 generates first and second control signals to induce the high voltage bi-directional MOSFET switch 340 and the low voltage bi-directional MOSFET switch 344, respectively, in the DC-DC voltage converter 160 to each transition to a closed operational state. After step 602, the method advances to step 604.

At step 604, the microcontroller 60 executes a first diagnostic function 650 (shown in FIG. 6) of a first subroutine. After step 604, the method advances to step 606.

At step 606, the microcontroller 60 executes a first diagnostic function 680 (shown in FIG. 7) of a second subroutine. After step 606, the method advances to step 608.

At step 608, the microcontroller 60 executes a first diagnostic function 710 (shown in FIG. 8) of a third subroutine. After step 608, the method advances to step 610.

At step 610, the microcontroller 60 executes a first diagnostic function 740 (shown in FIG. 9) of a fourth subroutine. After step 610, the method advances to step 612.

At step 612, the microcontroller 60 executes a second diagnostic function 770 (shown in FIGS. 10 and 11) of the second subroutine. After step 612, the method advances to step 614.

At step 614, the microcontroller 60 executes a second diagnostic function 800 (shown in FIGS. 12 and 13) of the first subroutine. After step 614, the method advances to step 616.

At step 616, the microcontroller 60 executes a second diagnostic function 830 (shown in FIGS. 14 and 15) of the fourth subroutine. After step 616, the method advances to step 618.

At step 618, the microcontroller 60 executes a second diagnostic function 858 (shown in FIGS. 16 and 17) of the third subroutine. After step 618, the method advances to step 620.

Figure 18:
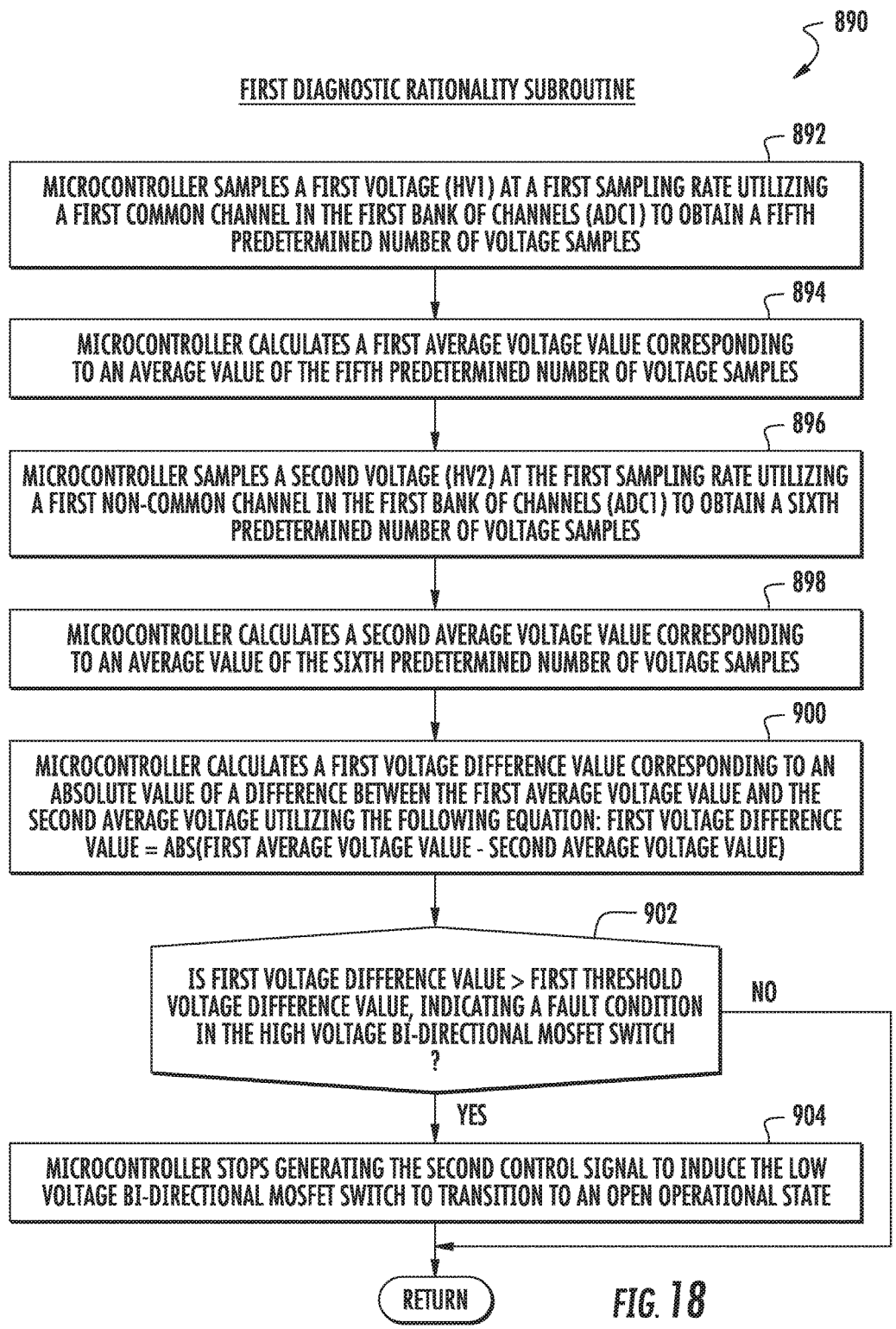

At step 620, the microcontroller 60 executes a first diagnostic rationality subroutine 890 (shown in FIG. 18). After step 620, the method advances to step 622.

Figure 19:
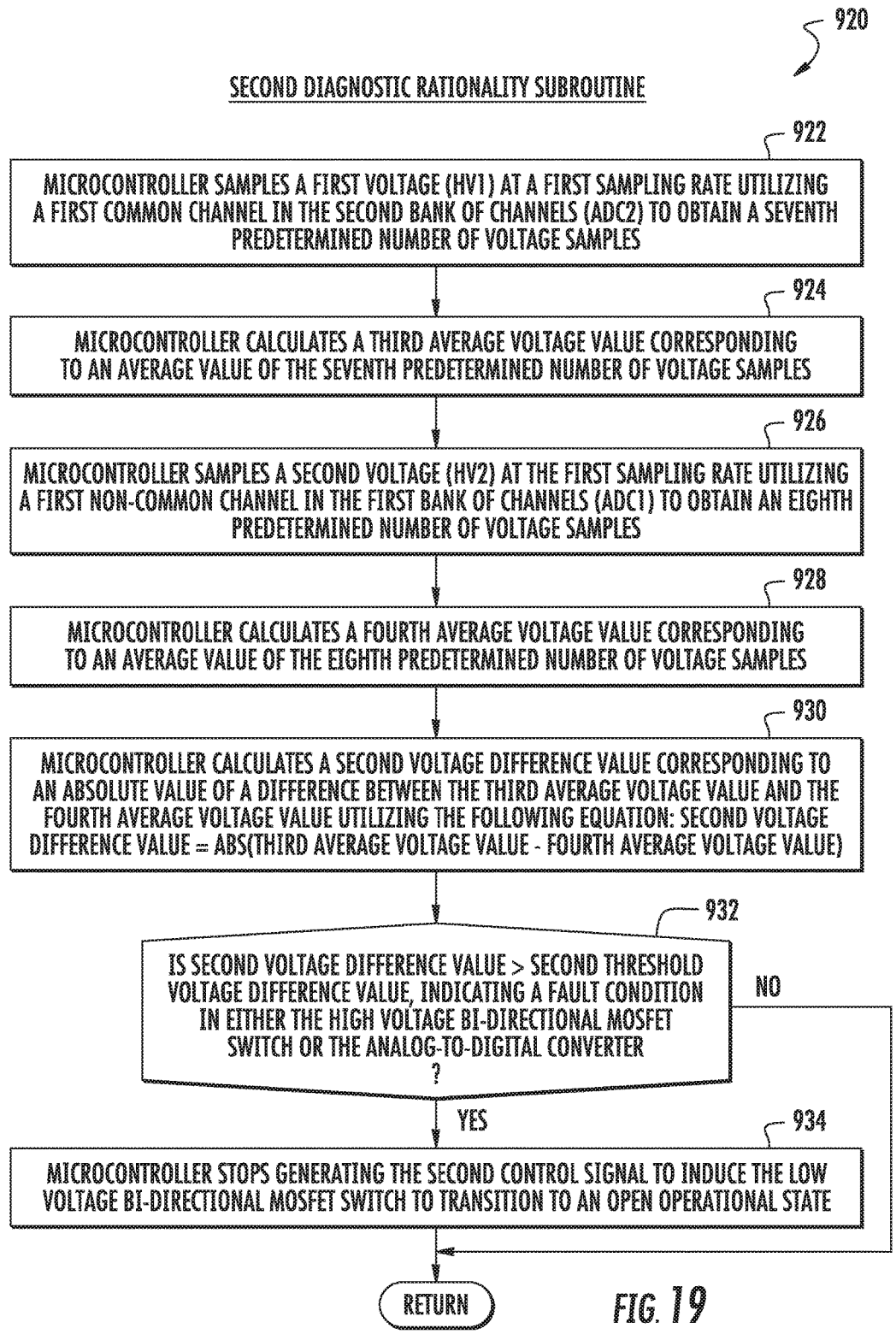

At step 622, the microcontroller 60 executes a second diagnostic rationality subroutine 920 (shown in FIG. 19). After step 622, the method advances to step 624.

Figure 20:
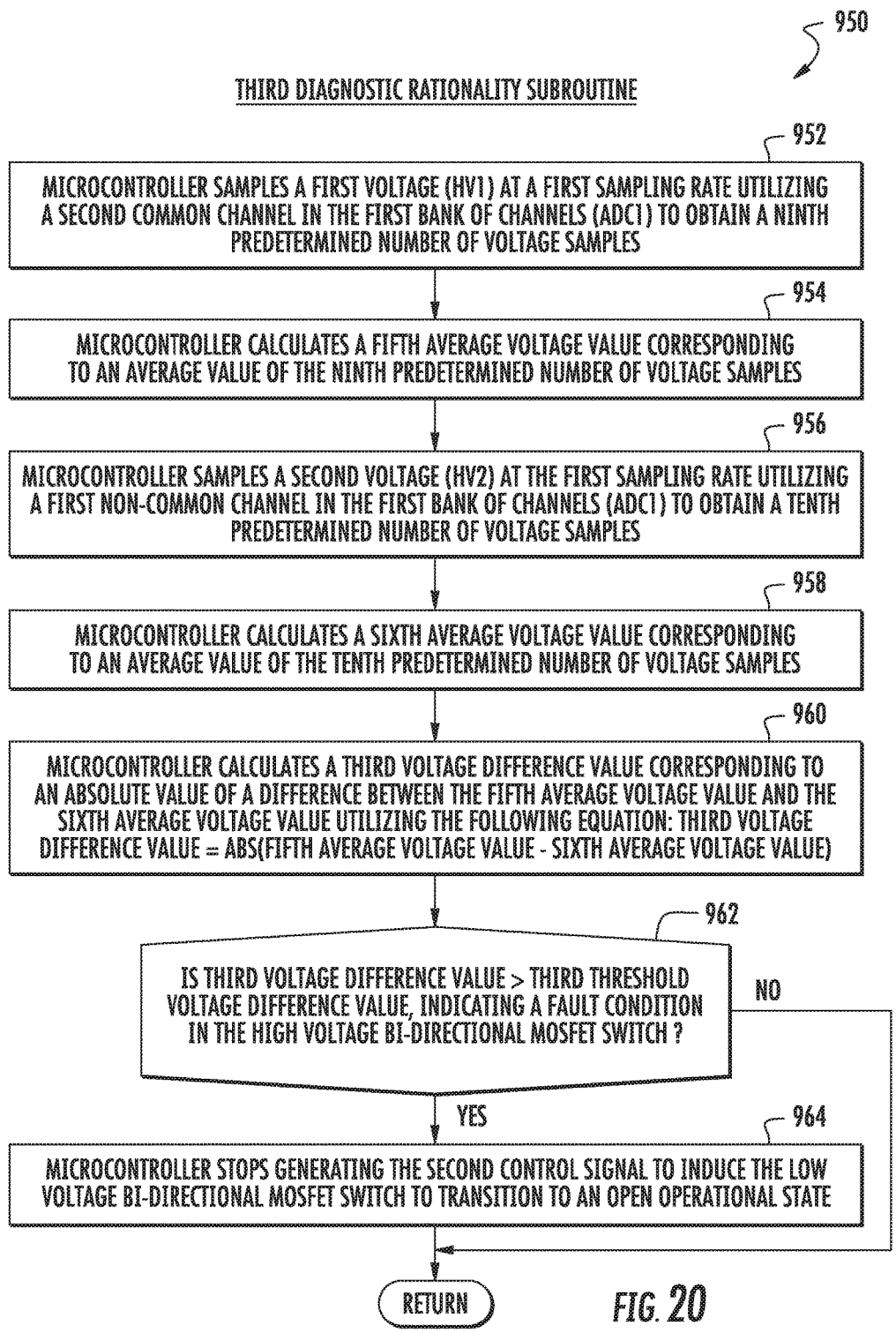

At step 624, the microcontroller 60 executes a third diagnostic rationality subroutine 950 (shown in FIG. 20). After step 624, the method advances to step 626.

Figure 21:
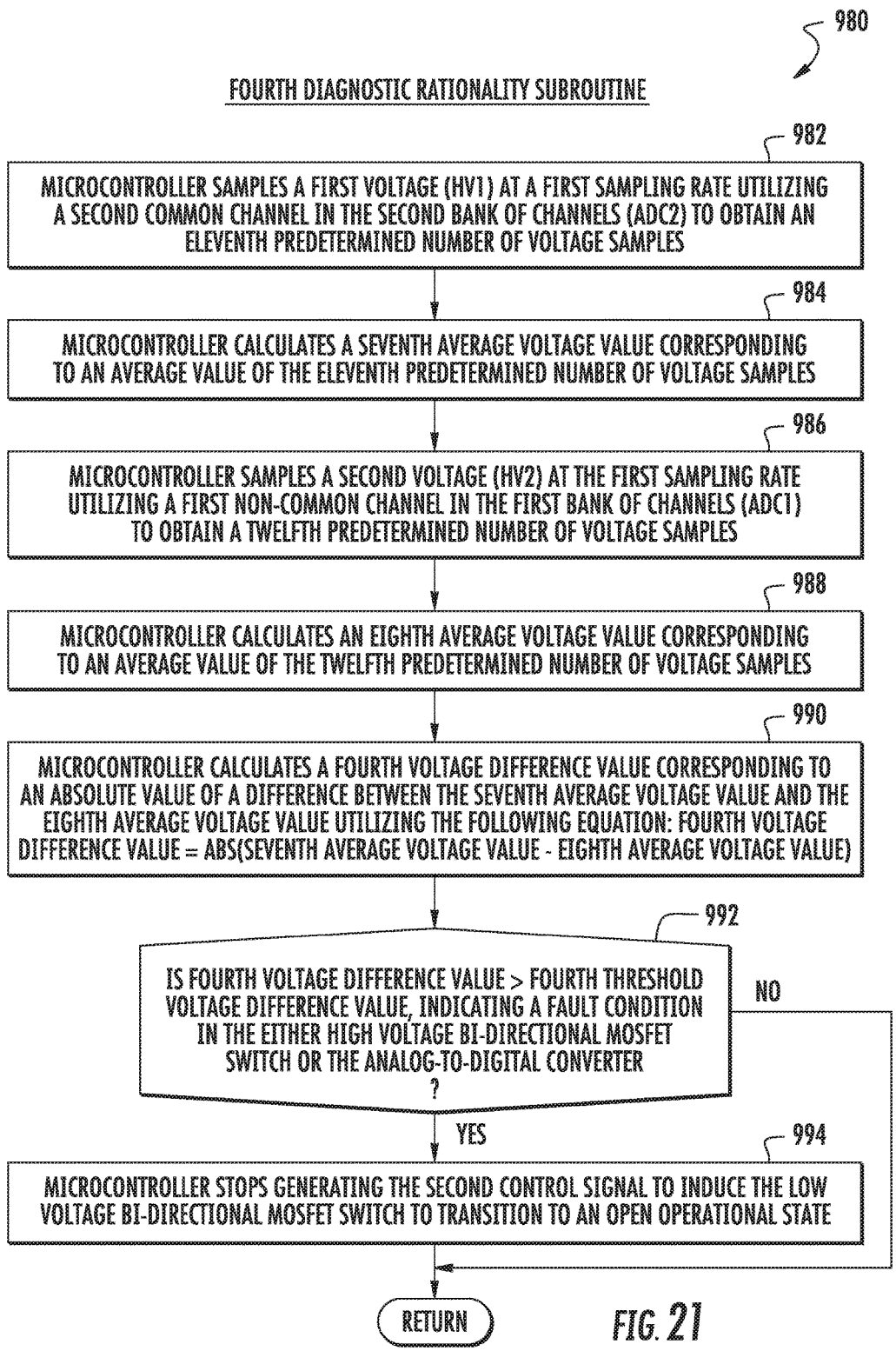

At step 626, the microcontroller 60 executes a fourth diagnostic rationality subroutine 980 (shown in FIG. 21).

Figure 6:
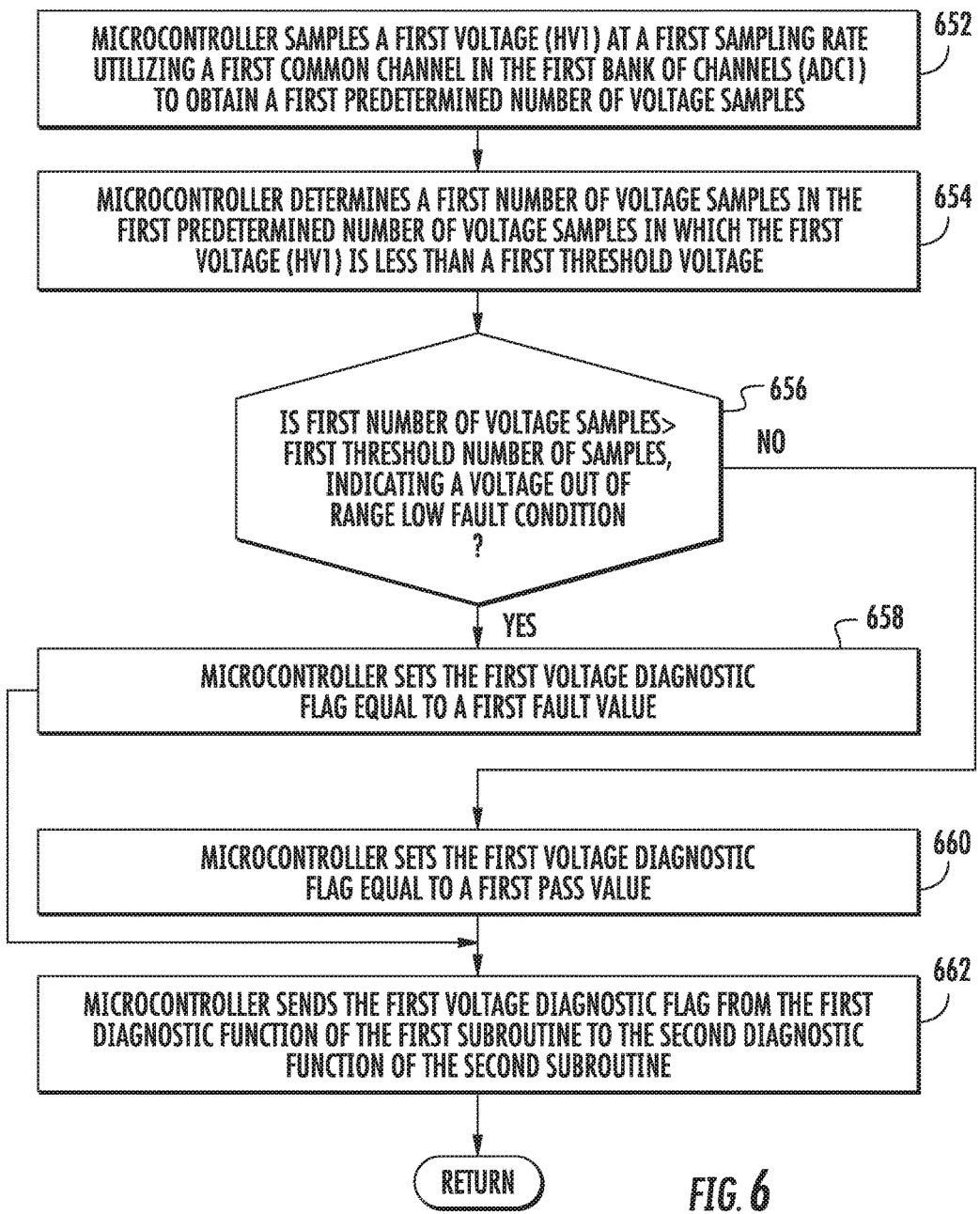

Referring to FIG. 6, the first diagnostic function 650 of the first subroutine will now be explained.

At step 652, the microcontroller 60 samples a first voltage (HV1) at a first sampling rate utilizing a first common channel 94 in the first bank of channels 76 (ADC1) to obtain a first predetermined number of voltage samples. After step 652, the method advances to step 654

At step 654, the microcontroller 60 determines a first number of voltage samples in the first predetermined number of voltage samples in which the first voltage (HV1) is less than a first threshold voltage. After step 654, the method advances to step 656.

At step 656, the microcontroller 60 makes a determination as to whether the first number of voltage samples is greater than a first threshold number of samples, indicating a voltage out of range low fault condition for the analog-to-digital converter 74. If the value of step 656 equals "yes", the method advances to step 658. Otherwise, the method advances to step 660.

At step 658, the microcontroller 60 sets the first voltage diagnostic flag equal to a first fault value. After step 658, the method advances to step 662.

Referring again to step 656, if the value of step 656 equals "no", the method advances to step 660. At step 660, the microcontroller 60 sets the first voltage diagnostic flag equal to a first pass value. After step 660, the method advances to step 662.

At step 662, the microcontroller 60 sends the first voltage diagnostic flag from the first diagnostic function 650 of the first subroutine to the second diagnostic function 770 (shown in FIGS. 10 and 11) of the second subroutine. After step 662, the method returns to the main routine 580 (shown in FIGS. 4 and 5).

Figure 7:
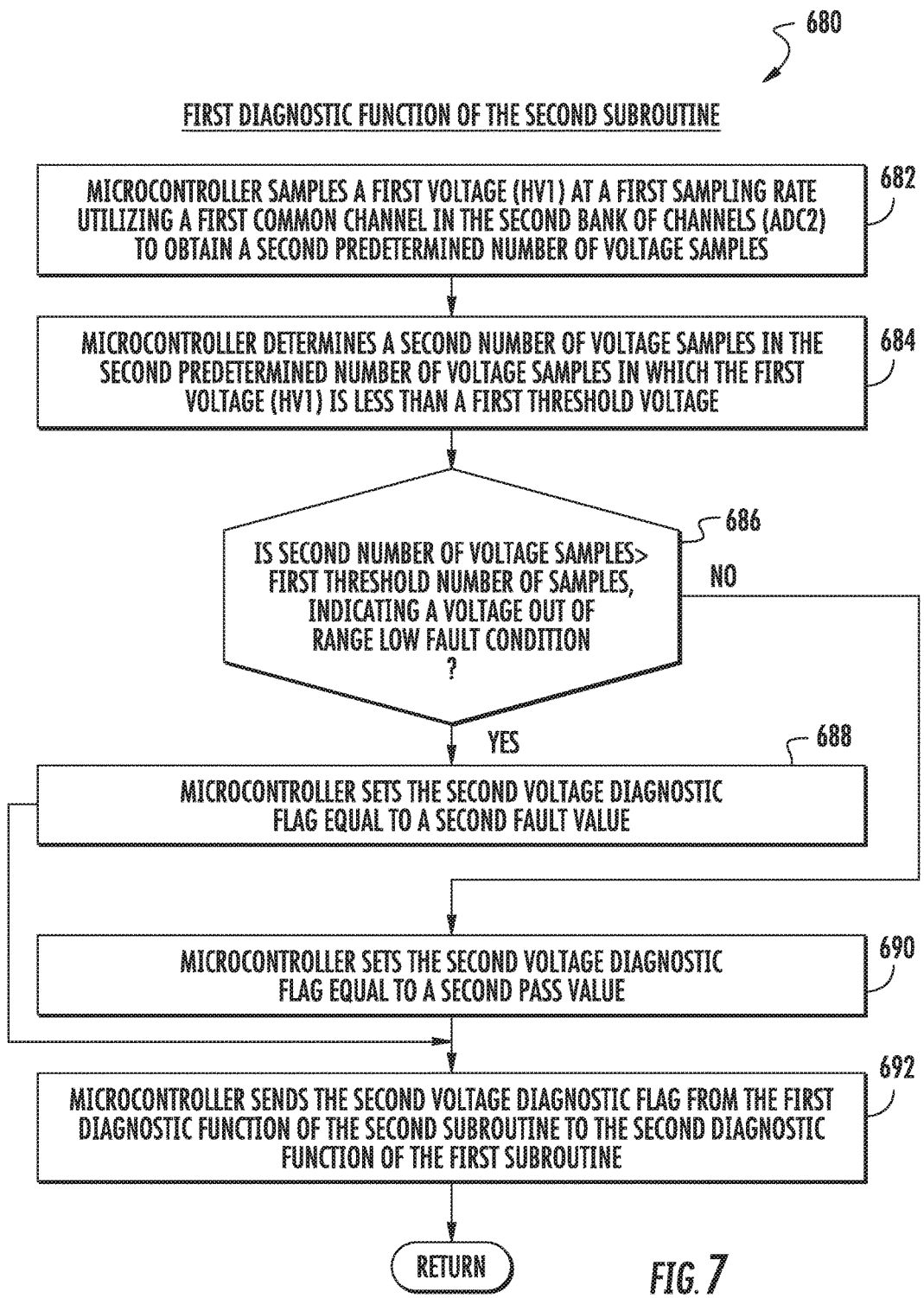

Referring to FIG. 7, the first diagnostic function 680 of the second subroutine will now be explained.

At step 682, the microcontroller 60 samples a first voltage (HV1) at the first sampling rate utilizing the first common channel 94 in the second bank of channels 78 (ADC2) to obtain a second predetermined number of voltage samples. After step 682, the method advances to step 684.

At step 684, the microcontroller 60 determines a second number of voltage samples in the second predetermined number of voltage samples in which the first voltage (HV1) is less than a first threshold voltage. After step 684, the method advances to step 686.

At step 686, the microcontroller 60 makes a determination as to whether the second number of voltage samples is greater than a first threshold number of samples, indicating a voltage out of range low fault condition for the analog-to-digital converter 74. If the value of 686 equals "yes", the method advances to step 688. Otherwise, the method advances to step 690.

At step 688, the microcontroller 60 sets the second voltage diagnostic flag equal to a second fault value. After step 688, the method advances to step 692.

Referring again to step 686, if the value of step 686 equals "no", the method advances to step 690. At step 690, the microcontroller 60 sets the second voltage diagnostic flag equal to a second pass value. After step 690, the method advances to step 692.

At step 692, the microcontroller 60 sends the second voltage diagnostic flag from the first diagnostic function 680 of the second subroutine to the second diagnostic function 800 (shown in FIGS. 12 and 13) of the first subroutine. After step 692, the method returns to the main routine 580 (shown in FIGS. 4 and 5).

Figure 8:
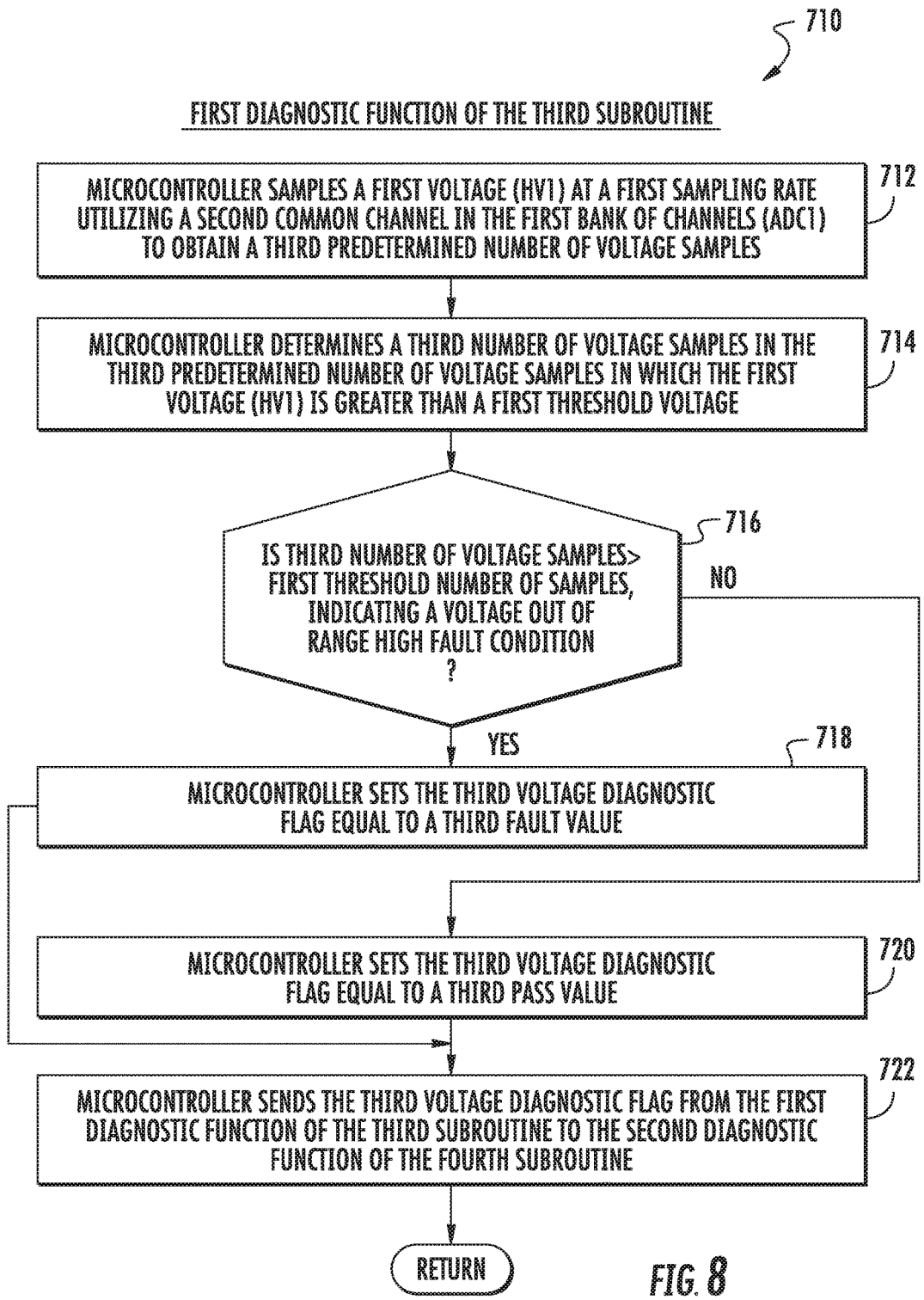

Referring to FIG. 8, the first diagnostic function 710 of the third subroutine will now be explained.

At step 712, the microcontroller 60 samples a first voltage (HV1) at the first sampling rate utilizing a second common channel 95 in the first bank of channels 76 (ADC1) to obtain a third predetermined number of voltage samples. After step 712, the method advances to step 714.

At step 714, the microcontroller 60 determines a third number of voltage samples in the third predetermined number of voltage samples in which the first voltage (HV1) is greater than a third threshold voltage. After step 714, the method advances to step 716.

At step 716, the microcontroller 60 makes a determination as to whether the third number of voltage samples is greater than the first threshold number of samples, indicating a voltage out of range high fault condition for the analog-to-digital converter 74. If the value of step 716 equals "yes", the method advances to step 718. Otherwise, the method advances to step 720.

At step 718, the microcontroller 60 sets the third voltage diagnostic flag equal to a third fault value. After step 718, the method advances to step 722.

Referring again to step 716, if the value of step 716 equals "no", the method advances to step 720. At step 720, the microcontroller 60 sets the third voltage diagnostic flag equal to a third pass value. After step 720, the method advances to step 722.

At step 722, the microcontroller 60 sends the third voltage diagnostic flag from the first diagnostic function 710 of the third subroutine to the second diagnostic function 830 (shown in FIGS. 14 and 15) of the fourth subroutine. After step 722, method returns to the main routine 580 (shown in FIGS. 4 and 5).

Figure 9:
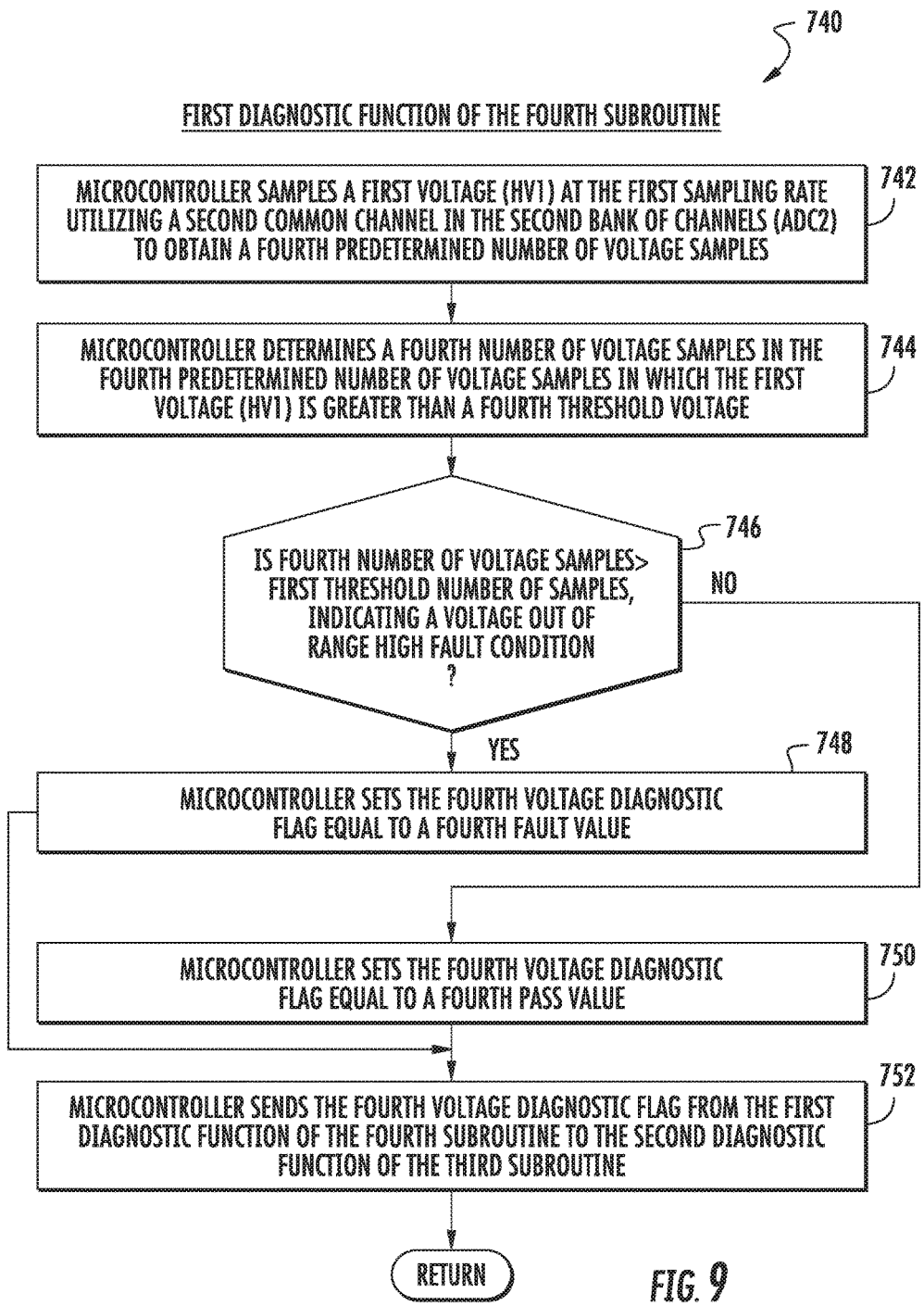

Referring to FIG. 9, the first diagnostic function 740 of the fourth subroutine will now be explained.

At step 742, the microcontroller 60 samples a first voltage (HV1) at the first sampling rate utilizing a second common channel 95 in the second bank of channels 78 (ADC2) to obtain a fourth predetermined number of voltage samples. After step 742, the method advances to step 744.

At step 744, the microcontroller 60 determines a fourth number of voltage samples in the fourth predetermined number of voltage samples in which the first voltage (HV1 is greater than a fourth threshold voltage. After step 744, the method advances to step 746.

At step 746, the microcontroller 60 makes a determination as to whether the fourth number of voltage samples is greater than the first threshold number of samples, indicating a voltage out of range high fault condition of the analog-to-digital converter 74. If the value of step 746 equals "yes", the method advances to step 748. Otherwise, the method advances to step 750.

At step 748, the microcontroller 60 sets the fourth voltage diagnostic flag equal to a fourth fault value. After step 748, the method advances to step 752.

Referring again to step 746, if the value of step 746 equals "no", the method advances to step 750. At step 750, microcontroller 60 sets the fourth voltage diagnostic flag equal to a fourth pass value. After step 750, the method advances to step 752.

At step 752, the microcontroller 60 sends the fourth voltage diagnostic flag from the first diagnostic function 740 of the fourth subroutine to the second diagnostic function 858 (shown in FIGS. 16 and 17) of the third subroutine. After step 752, the method returns the main routine 580 (shown in FIGS. 4 and 5).

Figure 10:
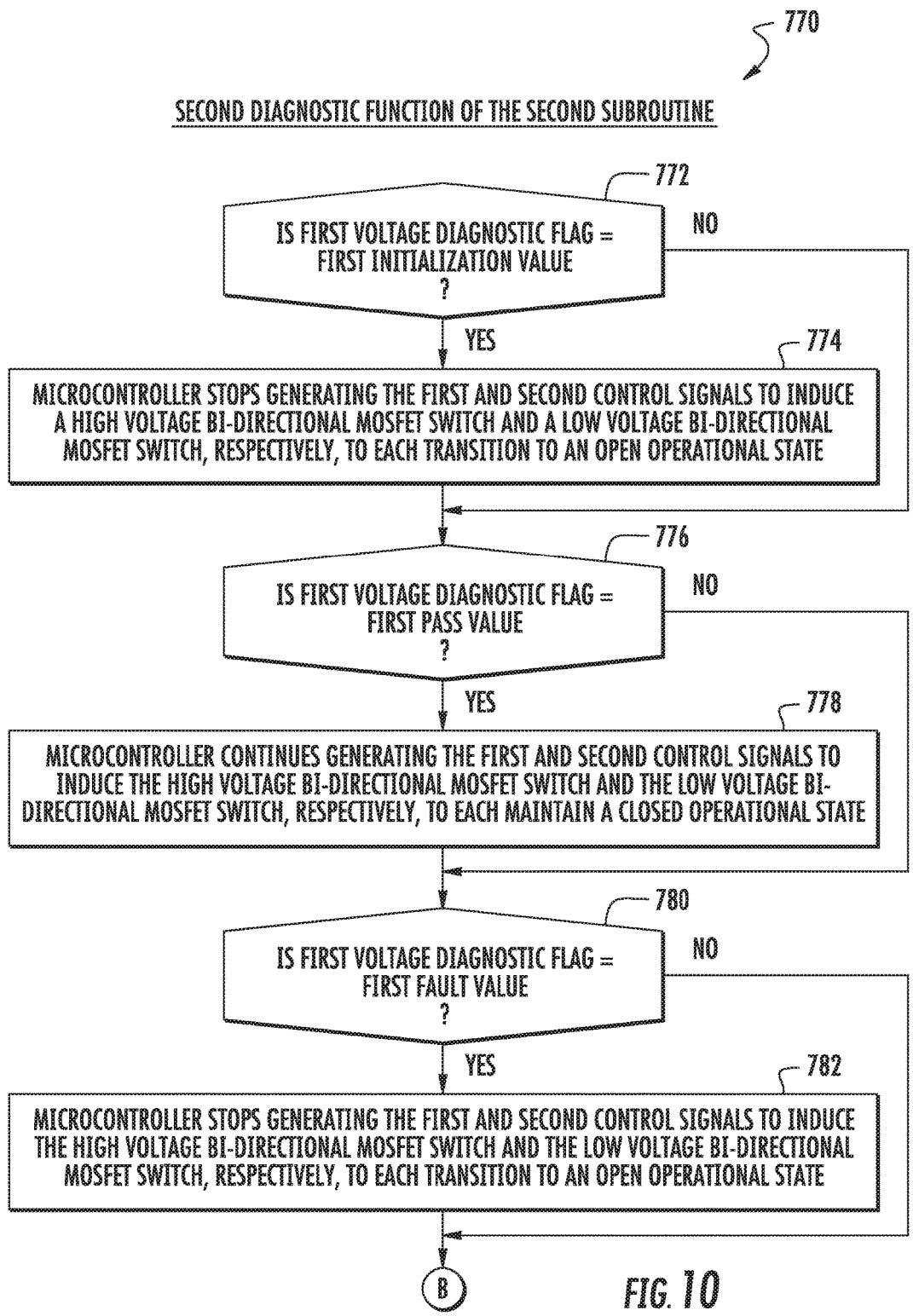
Figure 11:
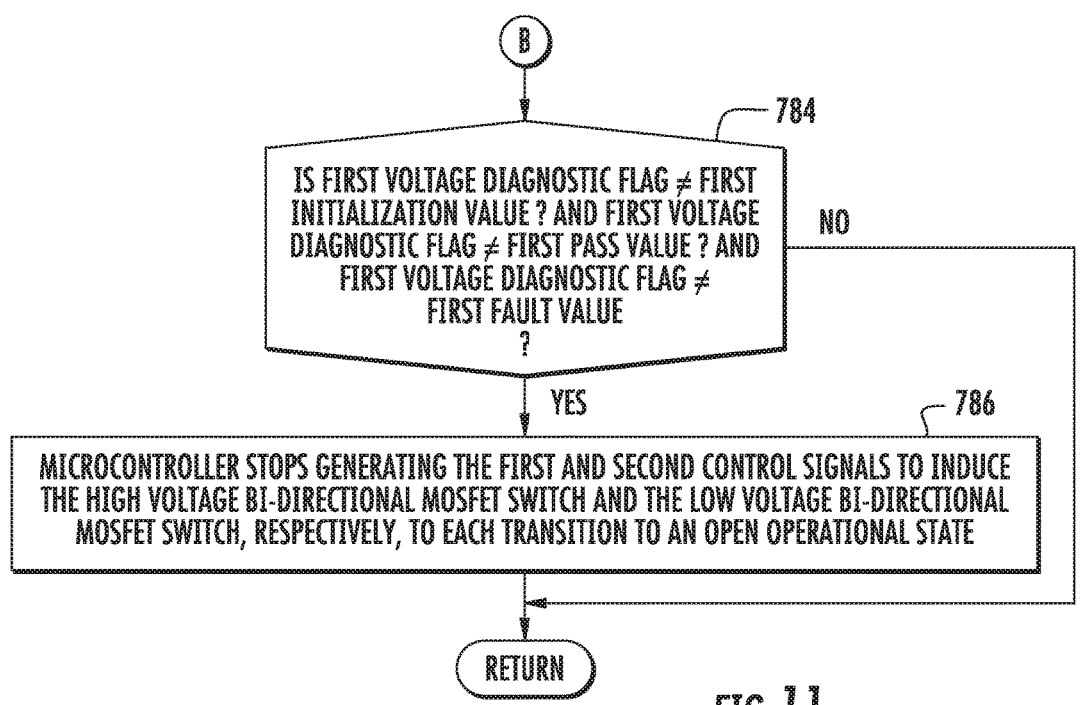

Referring to FIGS. 10 and 11, the second diagnostic function 770 of the second subroutine will now be explained.

At step 772, the microcontroller 60 makes a determination as to whether the first voltage diagnostic flag is equal to the first initialization value. If the value of step 772 equals "yes", the method advances to step 774. Otherwise, the method advances to step 776.

At step 774, the microcontroller 60 stops generating the first and second control signals to induce the high voltage bi-directional MOSFET switch 340 and the low voltage bi-directional MOSFET switch 344, respectively, to each transition to an open operational state. After step 774, the method advances to step 776.

At step 776, the microcontroller 60 makes a determination as to whether the first voltage diagnostic flag is equal to the first pass value. If the value of step 776 equals "yes", the method advances to step 778. Otherwise, the method advances to step 780.

At step 778, the microcontroller 60 continues generating the first and second control signals to induce the high voltage bi-directional MOSFET switch 340 and the low voltage bi-directional MOSFET switch 344, respectively, to each maintain a closed operational state. After step 778, the method advances to step 780.

At step 780, the microcontroller 60 makes a determination as to whether the first voltage diagnostic flag is equal to the first fault value. If the value of step 780 equals "yes", the method advances to step 782. Otherwise, the method advances to step 784.

At step 782, the microcontroller 60 stops generating the first and second control signals to induce the high voltage bi-directional MOSFET switch 340 and the low voltage bi-directional MOSFET switch 344, respectively, to each transition to an open operational state. After step 782, the method advances to step 784.

At step 784, the microcontroller 60 makes a determination as to whether the first voltage diagnostic flag is not equal to the first initialization value, and whether the first voltage diagnostic flag is not equal to the first pass value, and whether the first voltage diagnostic flag is not equal to the first fault value. If the value of step 784 equals "yes", the method advances to step 786. Otherwise, the method returns to the main routine 580 (shown in FIGS. 4 and 5).

At step 786, the microcontroller 60 stops generating first and second control signals to induce the high voltage bi-directional MOSFET switch 340 and the low voltage bi-directional MOSFET switch 344, respectively, to each transition to an open operational state. After step 786, the method returns to the main routine 580 (shown in FIGS. 4 and 5).

Figure 12:
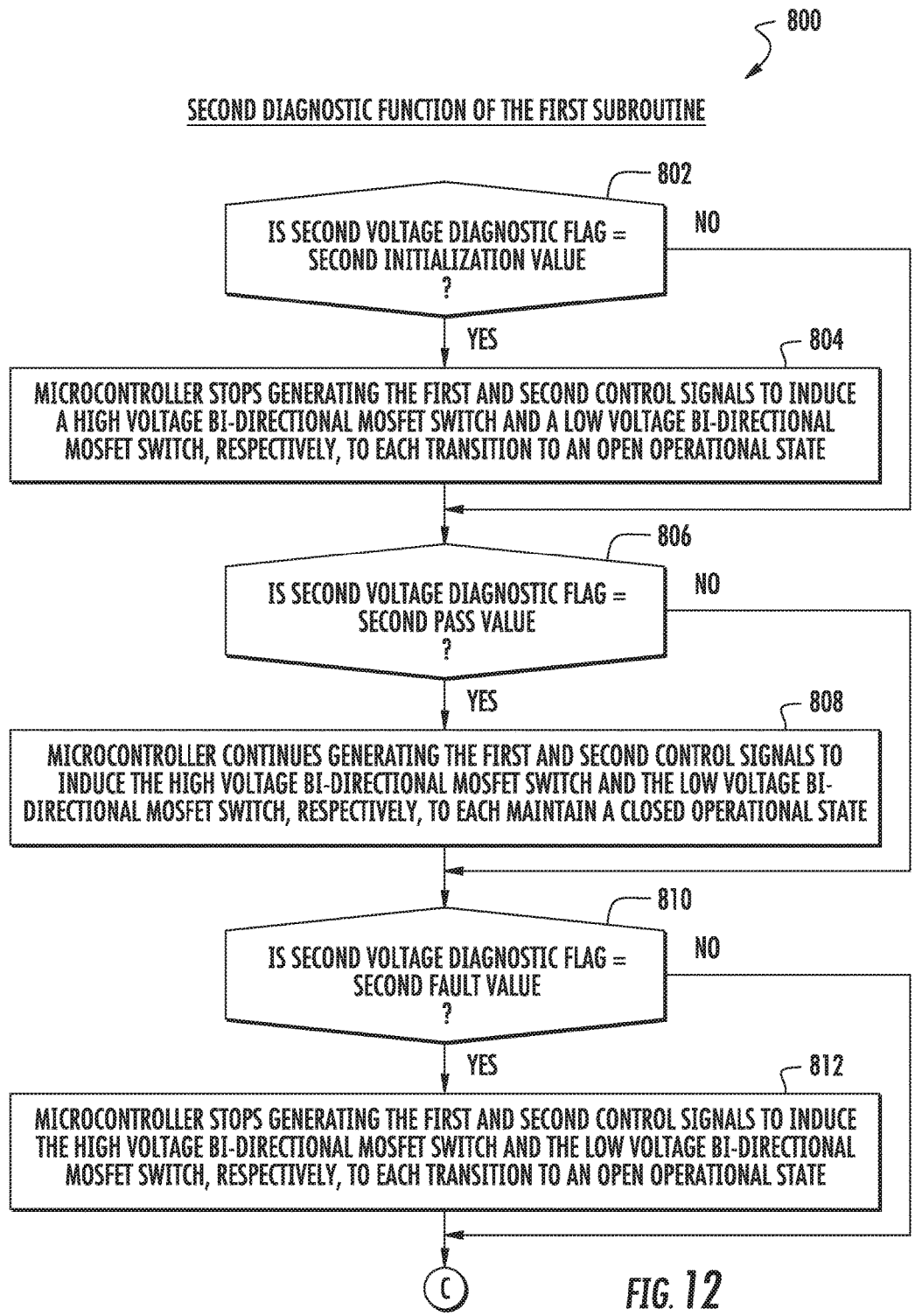
Figure 13:
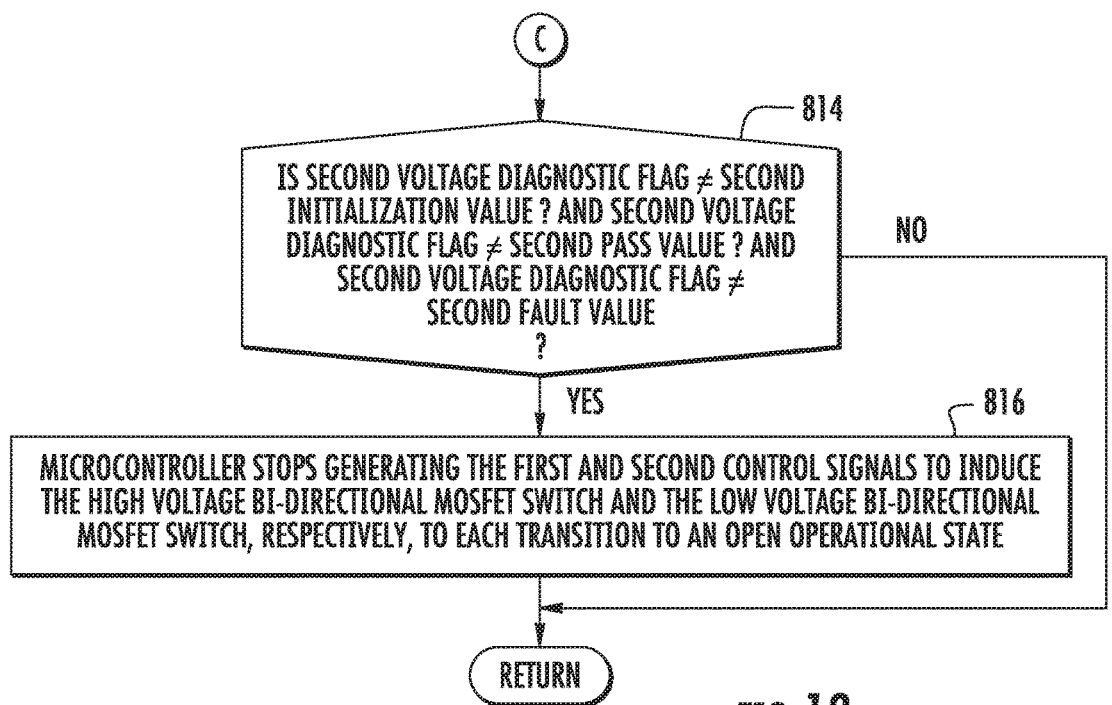

Referring to FIGS. 12 and 13, the second diagnostic function 800 of the first subroutine will now be explained.

At step 802, the microcontroller 60 makes a determination as to whether the second voltage diagnostic flag is equal to the second initialization value. If the value of step 802 equals "yes", the method advances to step 804. Otherwise, the method advances to step 806.

At step 804, the microcontroller 60 stops generating the first and second control signals to induce the high voltage bi-directional MOSFET switch 340 and the low voltage bi-directional MOSFET switch 344, respectively, to each transition to an open operational state. After step 804, the method advances to step 806.

At step 806, the microcontroller 60 makes a determination as to whether the second voltage diagnostic flag is equal to the second pass value. If the value of step 806 equals "yes", the method advances to step 808. Otherwise, the method advances to step 810.

At step 808, the microcontroller 60 continues generating the first and second control signals to induce the high voltage bi-directional MOSFET switch 340 and the low voltage bi-directional MOSFET switch 344, respectively, to each maintain a closed operational state. After step 808, the method advances to step 810.

At step 810, the microcontroller 60 makes a determination as to whether the second voltage diagnostic flag is equal to the second fault value. If the value of step 810 equals "yes", the method advances to step 812. Otherwise, the method advances to step 814.

At step 812, the microcontroller 60 stops generating the first and second control signals to induce the high voltage bi-directional MOSFET switch 340 and the low voltage bi-directional MOSFET switch 344, respectively, to each transition to an open operational state. After step 812, the method advances to step 814.

At step 814, the microcontroller 60 makes a determination as to whether the second voltage diagnostic flag is not equal to the second initialization value, and whether the second voltage diagnostic flag is not equal to the second pass value, and whether the second voltage diagnostic flag is not equal to the second fault value. If the value of step 814 equals "yes", the method advances to step 816. Otherwise, the method returns to the main routine 580 (shown in FIGS. 4 and 5).

At step 816, the microcontroller 60 stops generating the first and second control signals to induce the high voltage bi-directional MOSFET switch 340 and the low voltage bi-directional MOSFET switch 344, respectively, to each transition to an open operational state. After step 816, the method returns to the main routine 580 (shown in FIGS. 4 and 5).

Figure 14:
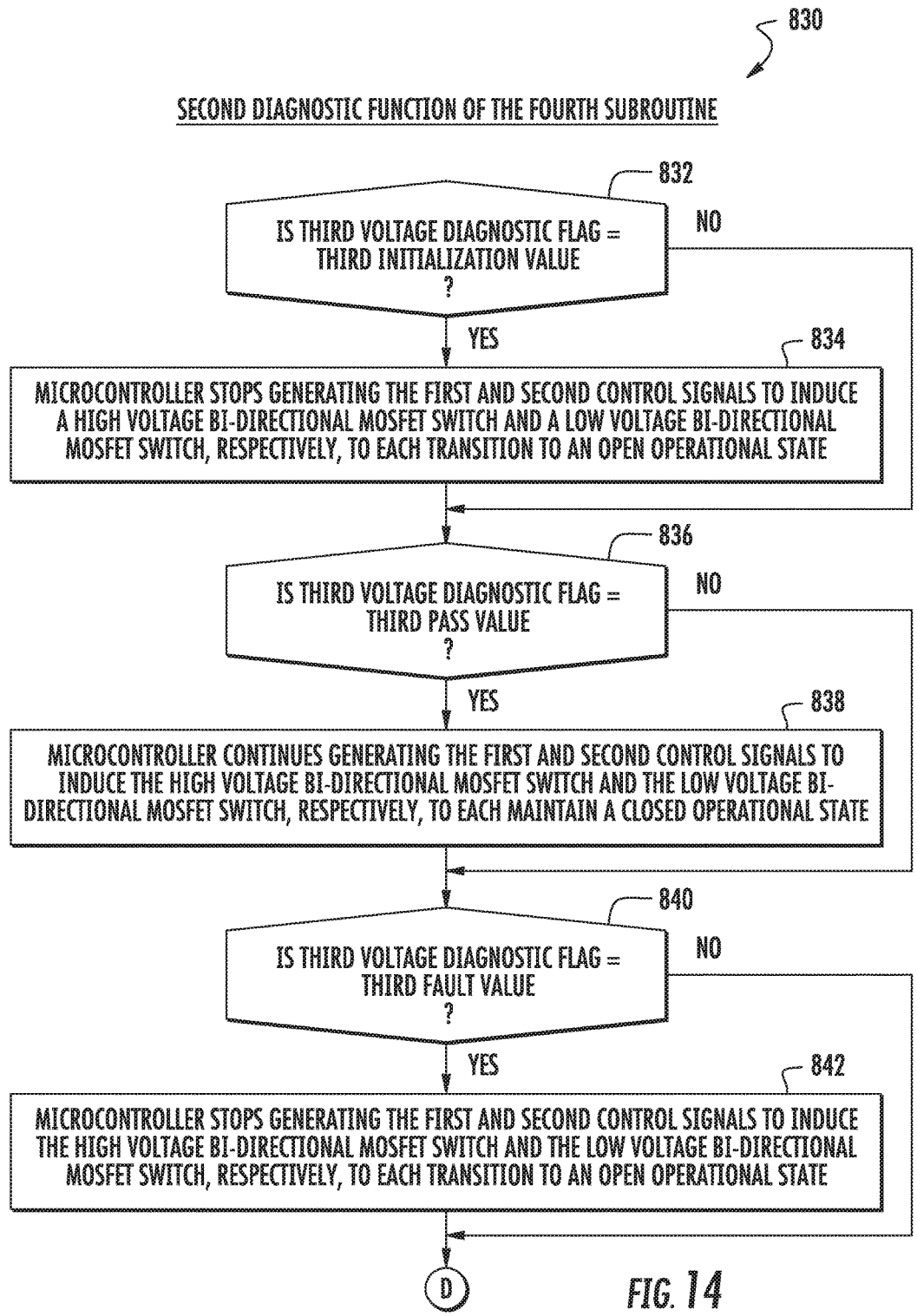
Figure 15:
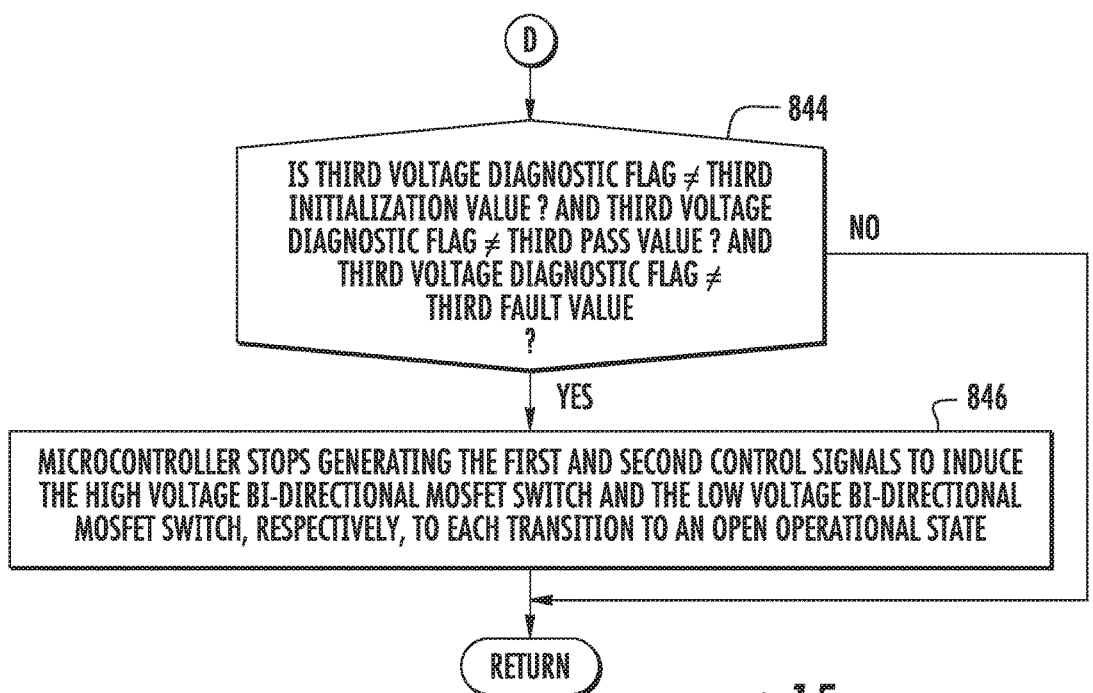

Referring to FIGS. 14 and 15, the second diagnostic function 830 of the fourth subroutine will now be explained.

At step 832, the microcontroller 60 makes a determination as to whether the third voltage diagnostic flag is equal to the third initialization value. If the value of step 832 equals "yes", the method advances to step 832. Otherwise, the method advances to step 836.

At step 834, the microcontroller 60 stops generating the first and second control signals to induce the high voltage bi-directional MOSFET switch 340 and the low voltage bi-directional MOSFET switch 344, respectively, to each transition to an open operational state. After step 834, the method advances to step 836.

At step 836, the microcontroller 60 makes a determination as to whether the third voltage diagnostic flag is equal to the third pass value. If the value of step 836 equals "yes", the method advances to step 838. Otherwise, the method advances to step 840.

At step 838, the microcontroller 60 continues generating the first and second control signals to induce the high voltage bi-directional MOSFET switch 340 and the low voltage bi-directional MOSFET switch 344, respectively, to each maintain a closed operational state. After step 838, the method advances to step 840.

At step 840, the microcontroller 60 makes a determination as to whether the third voltage diagnostic flag is equal to the third fault value. If the value of step 840 equals "yes", the method advances to step 842. Otherwise, the method advances to step 844.

At step 842, the microcontroller 60 stops generating the first and second control signals to induce the high voltage bi-directional MOSFET switch 340 and the low voltage bi-directional MOSFET switch 344, respectively, to each transition to an open operational state. After step 842, the method advances to step 844.

At step 844, the microcontroller 60 makes a determination as to whether the third voltage diagnostic flag is not equal to the third initialization value, and whether the third voltage diagnostic flag is not equal to the third pass value, and whether the third voltage diagnostic flag is not equal to the third fault value. If the value of step 844 equals "yes", the method advances to step 846. Otherwise, the method returns to the main routine 580 (shown in FIGS. 4 and 5).

At step 846, the microcontroller 60 stops generating the first and second control signals to induce the high voltage bi-directional MOSFET switch 340 and the low voltage bi-directional MOSFET switch 344, respectively, to each transition to an open operational state. After step 846, the method returns to the main routine 580 (shown in FIGS. 4 and 5).

Figure 16:
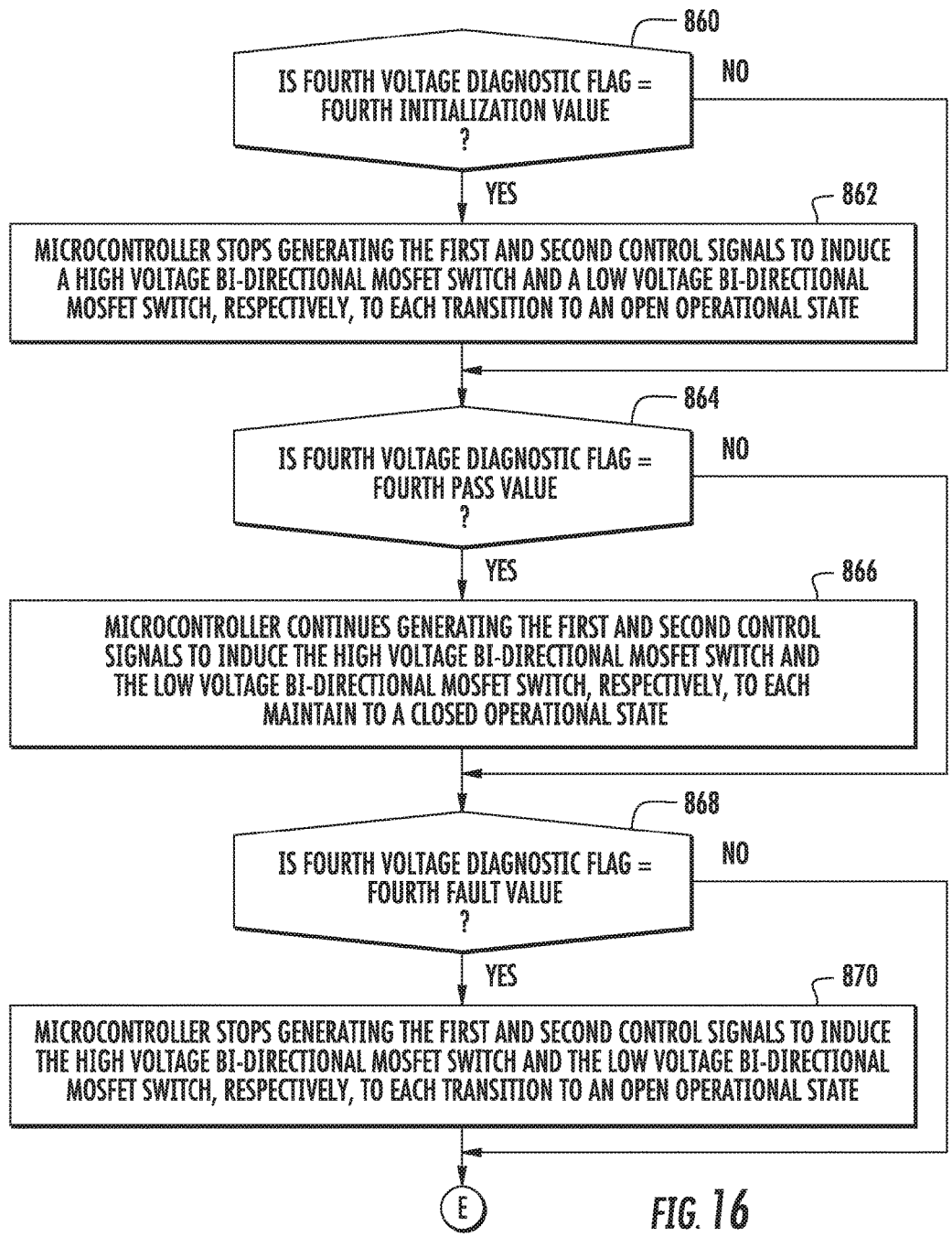
Figure 17:
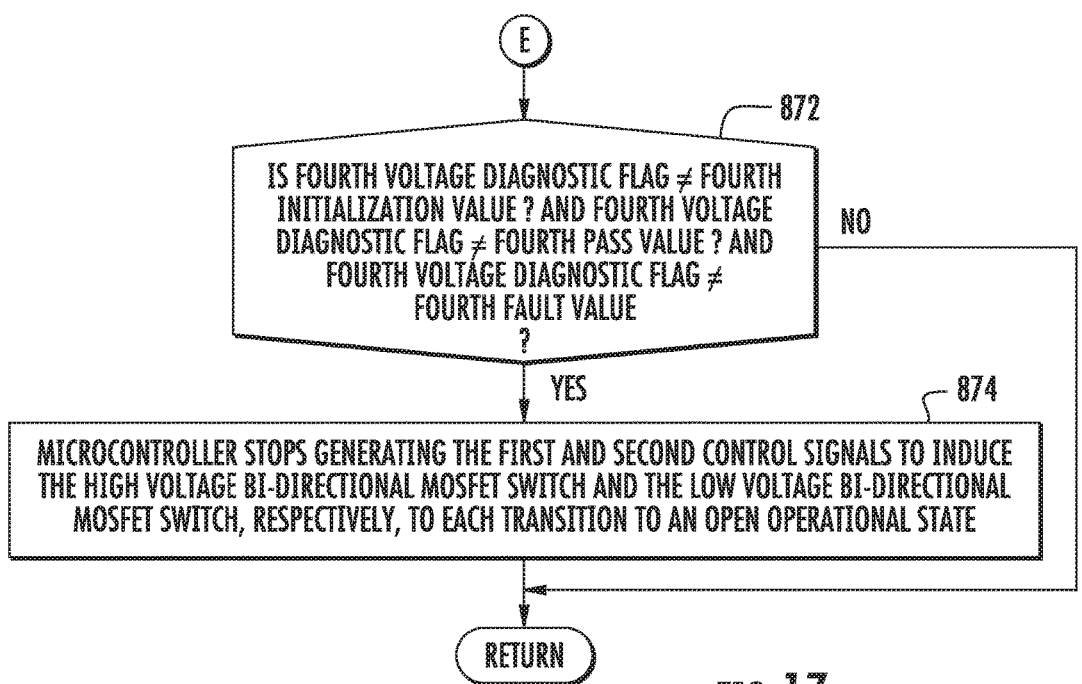

Referring to FIGS. 16 and 17, the second diagnostic function 858 of the third subroutine will now be explained.

At step 860, the microcontroller 60 makes a determination as to whether the fourth voltage diagnostic flag is equal to the fourth initialization value. If the value of step 806 equals "yes", the method advances to step 862. Otherwise, the method advances to step 864.

At step 862, the microcontroller 60 stops generating the first and second control signals to induce the high voltage bi-directional MOSFET switch 340 and the low voltage bi-directional MOSFET switch 344, respectively, to each transition to an open operational state. After step 862, the method advances to step 864.

At step 864, the microcontroller 60 makes a determination as to whether the fourth voltage diagnostic flag is equal to the fourth pass value. If the value of step 864 equals "yes", the method advances to step 866. Otherwise, the method advances to step 868.

At step 866, the microcontroller 60 continues generating the first and second control signals to induce the high voltage bi-directional MOSFET switch 340 and the low voltage bi-directional MOSFET switch 344, respectively, to each maintain a closed operational state. After step 866, the method advances to step 868.

At step 868, the microcontroller 60 makes a determination as to whether the fourth voltage diagnostic flag is equal to the fourth fault value. If the value of step 868 equals "yes", the method advances to step 870. Otherwise, the method advances to step 872.

At step 870, the microcontroller 60 stops generating the first and second control signals to induce the high voltage bi-directional MOSFET switch 340 and the low voltage bi-directional MOSFET switch 344, respectively, to each transition to an open operational state. After step 870, the method advances to step 872.

At step 872, the microcontroller 60 makes a determination as to whether the fourth voltage diagnostic flag is not equal to the fourth initialization value, and whether the fourth voltage diagnostic flag is not equal to the fourth pass value, and whether the fourth voltage diagnostic flag is not equal to the fourth fault value. If the value of step 872 equals "yes", the method advances to step 874. Otherwise, the method returns to the main routine 580 (shown in FIGS. 4 and 5).

At step 874, the microcontroller 60 stops generating the first and second control signals to induce the high voltage bi-directional MOSFET switch 340 and the low voltage bi-directional MOSFET switch 344, respectively, to each transition to an open operational state. After step 874, the method returns to the main routine 580 (shown in FIGS. 4 and 5).

Referring to FIG. 18, the first diagnostic rationality subroutine 890 will now be explained.

At step 892, the microcontroller 60 samples a first voltage (HV1) at a first sampling rate utilizing the first common channel 94 in the first bank of channels 76 (ADC1) to obtain a fifth predetermined number of voltage samples plurality of voltage samples. After step 892, the method advances to step 894.

At step 894, the microcontroller 60 calculates a first average voltage value corresponding to an average value of the fifth predetermined number of voltage samples. After step 894, the method advances to step 896.

At step 896, the microcontroller 60 samples a second voltage (HV2) at the first sampling rate utilizing a first non-common channel 96 in the first bank of channels 76 (ADC1) to obtain a sixth predetermined number of voltage samples. After step 896, the method advances to step 898.

At step 898, the microcontroller 60 calculates a second average voltage value corresponding to an average value of the sixth predetermined number of voltage samples. After step 898, the method advances to step 900.

At step 900, the microcontroller 60 calculates a first voltage difference value corresponding to an absolute value of a difference between the first average voltage value and the second average voltage value utilizing the following equation: first voltage difference value=Abs(first average voltage value−second average voltage value), wherein "Abs" corresponds to an absolute value function. After step 900, the method advances to step 902.

At step 902, the microcontroller 60 makes a determination as to whether the first voltage difference value is greater than a first threshold voltage difference value, indicating a fault condition in the high voltage bi-directional MOSFET switch 340. If the value of step 902 equals "yes", the method advances to step 904. Otherwise, the method returns to the main routine 580 (shown in FIGS. 4 and 5).

At step 904, the microcontroller 60 stops generating the second control signal to induce the low voltage bi-directional MOSFET switch 344 to transition to an open operational state. After step 904, the method returns to the main routine 580 (shown in FIGS. 4 and 5).

Referring to FIG. 19, the second diagnostic rationality subroutine 920 will now be explained.

At step 922, the microcontroller 60 samples a first voltage (HV1) at a first sampling rate utilizing the first common channel 94 in the second bank of channels 78 (ADC2) to obtain a seventh predetermined number of voltage samples. After step 922, the method advances to step 924.

At step 924, the microcontroller 60 calculates a third average voltage value corresponding to an average value of the seventh predetermined number of voltage samples. After step 924, the method advances to step 926.

At step 926, the microcontroller 60 samples a second voltage (HV2) at the first sampling rate utilizing a first non-common channel 96 in the first bank of channels 76 (ADC1) to obtain an eighth predetermined number of voltage samples. After step 926, the method advances to step 928.

At step 928, the microcontroller 60 calculates a fourth average voltage value corresponding to an average value of the eighth predetermined number of voltage samples. After step 928, the method advances to step 930.

At step 930, the microcontroller 60 calculates a second voltage difference value corresponding to an absolute value of a difference between the third average voltage value and the fourth average voltage value utilizing the following equation: second voltage difference value=Abs(third average voltage value−fourth average voltage value), wherein "Abs" corresponds to an absolute value function. After step 930, the method advances to step 932.

At step 932, the microcontroller 60 makes a determination as to whether the second voltage difference value is greater than a second threshold voltage difference value, indicating a fault condition in either the high voltage bi-directional MOSFET switch 340 or the analog-to-digital converter. If the value of step 932 equals "yes", the method advances to step 934. Otherwise, the method returns to the main routine 580 (shown in FIGS. 4 and 5).

At step 934, the microcontroller 60 stops generating the second control signal to induce the low voltage bi-directional MOSFET switch 344 to transition to an open operational state. After step 934, the method returns to the main routine 580 (shown in FIGS. 4 and 5).

Referring to FIG. 20, the third diagnostic rationality subroutine 950 will now be explained.

At step 952, the microcontroller 60 samples a first voltage (HV1) at a first sampling rate utilizing a second common channel 95 in the first bank of channels 76 (ADC1) to obtain a ninth predetermined number of voltage samples. After step 952, the method advances to step 954.

At step 954, the microcontroller 60 calculates a fifth average voltage value corresponding to an average value of the ninth predetermined number of voltage samples. After step 954, the method advances to step 956.

At step 956, the microcontroller 60 samples a second voltage (HV2) at the first sampling rate utilizing a first non-common channel 96 in the first bank of channels 76 (ADC1) to obtain a tenth predetermined number of voltage samples. After step 956, the method advances to step 958.

At step 958, the microcontroller 60 calculates a sixth average voltage value corresponding to an average value of the tenth predetermined number of voltage samples. After step 958, the method advances to step 960.

At step 960, the microcontroller 60 calculates a third voltage difference value corresponding to an absolute value of a difference between the fifth average voltage value and the sixth average voltage value utilizing the following equation: third voltage difference value=Abs(fifth average voltage value−sixth average voltage value), wherein "Abs" corresponds to an absolute value function. After step 960, the method advances to step 962.

At step 962, the microcontroller 60 makes a determination as to whether the third voltage difference value is greater than the third threshold voltage difference value, indicating a fault condition in the high voltage bi-directional MOSFET switch 340. If the value of step 962 equals "yes", the method advances to step 964. Otherwise, the method returns to the main routine 580 (shown in FIGS. 4 and 5).

At step 964, the microcontroller 60 stops generating the second control signal to induce the low voltage bi-directional MOSFET switch 344 to transition to an open operational state. After step 964, the method returns to the main routine 580 (shown in FIGS. 4 and 5).

Referring to FIG. 21, the fourth diagnostic rationality subroutine 980 will now be explained.

At step 982, the microcontroller 60 samples a first voltage (HV1) at a first sampling rate utilizing a second common channel 95 in the second bank of channels 78 (ADC2) to obtain an eleventh predetermined number of voltage samples. After step 982, the method advances to step 984.

At step 984, the microcontroller 60 calculates a seventh average voltage value corresponding to an average value of the eleventh predetermined number of voltage samples. After step 984, the method advances to step 986.

At step 986, the microcontroller 60 samples a second voltage (HV2) at the first sampling rate utilizing a first non-common channel 96 in the first bank of channels 76

(ADC1) to obtain a twelfth predetermined number of voltage samples. After step 986, the method advances to step 988.

At step 988, the microcontroller 60 calculates an eighth average voltage value corresponding to an average value of the twelfth predetermined number of voltage samples. After step 988, the method advances to step 990.

At step 990, the microcontroller 60 calculates a fourth voltage difference value corresponding to an absolute value of a difference between the seventh average voltage value and the eighth average voltage value utilizing the following equation: fourth voltage difference value=Abs(seventh average voltage value−eighth average voltage value), wherein "Abs" corresponds to an absolute value function. After step 990, the method advances to step 992.

At step 992, the microcontroller 60 makes a determination as to whether the fourth voltage difference value is greater than the fourth threshold voltage difference value, indicating a fault condition in either the high voltage bi-directional MOSFET switch 340 or the analog-to-digital converter 74. If the value of step 992 equals "yes", the method advances to step 994. Otherwise, the method returns the main routine 580 (shown in FIGS. 4 and 5).

At step 994, the microcontroller 60 stops generating the second control signal to induce the low voltage bi-directional MOSFET switch 344 to transition to an open operational state. After step 994, the method returns the main routine 580 (shown in FIGS. 4 and 5).

The diagnostic system for a DC-DC voltage converter described herein provides a substantial advantage over other systems and methods. In particular, the diagnostic system provides a technical effect of obtaining diagnostic diversity by sampling a first voltage at a first node of a high voltage bi-directional MOSFET switch using a common channel in a first bank of channels of an analog-to-digital converter, and then sampling the first voltage using the common channel in a second bank of channels of the analog-to-digital converter to determine fault conditions associated with the high voltage bi-directional MOSFET switch.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A diagnostic system for a DC-DC voltage converter having a low voltage switch and a high voltage switch, the high voltage switch having first and second nodes with first and second voltages, respectively, comprising:

a microcontroller having an analog-to-digital converter with a first bank of channels including a first common channel, and a second bank of channels including the first common channel;

an electrical sense line being electrically coupled between and to the first common channel and the first node of the high voltage switch of the DC-DC voltage converter for receiving the first voltage at the first common channel;

the microcontroller sampling the first voltage at a first sampling rate utilizing the first common channel in the first bank of channels to obtain a first predetermined number of voltage samples;

the microcontroller determining a first number of voltage samples in the first predetermined number of voltage samples in which the first voltage is less than a first threshold voltage;

the microcontroller setting a first voltage diagnostic flag equal to a first fault value if the first number of voltage samples is greater than a first threshold number of voltage samples indicating a voltage out of range low fault condition for the analog-to-digital converter;

the microcontroller sampling the first voltage at the first sampling rate utilizing the first common channel in the second bank of channels to obtain a second predetermined number of voltage samples;

the microcontroller determining a second number of voltage samples in the second predetermined number of voltage samples in which the first voltage is less than the first threshold voltage;

the microcontroller setting a second voltage diagnostic flag equal to a second first fault value if the second number of voltage samples is greater than the first threshold number of voltage samples indicating the voltage out of range low fault condition for the analog-to-digital converter; and the microcontroller stopping a generation of a control signal to induce the high voltage switch to transition to an open operational state, if the first voltage diagnostic flag is equal to the first fault value, or the second voltage diagnostic flag is equal to the second fault value.

2. The diagnostic system of claim 1, wherein:

the microcontroller initializing the first voltage diagnostic flag to a first initialization value before sampling the first voltage at the first sampling rate utilizing the first common channel in the first bank of channels; and the microcontroller initializing the second voltage diagnostic flag to a second initialization value before sampling the first voltage at the first sampling rate utilizing the first common channel in the second bank of channels.

3. A diagnostic system for a DC-DC voltage converter having a low voltage switch and a high voltage switch, the high voltage switch having first and second nodes with first and second voltages, respectively, comprising:

a microcontroller having an analog-to-digital converter with a first bank of channels including a first common channel, and a second bank of channels including the first common channel;

an electrical sense line being electrically coupled between and to the first common channel and the first node of the high voltage switch of the DC-DC voltage converter such that the first common channel receives the first voltage;

the microcontroller sampling the first voltage at a first sampling rate utilizing the first common channel in the first bank of channels to obtain a first predetermined number of voltage samples;

the microcontroller determining a first number of voltage samples in the first predetermined number of voltage samples in which the first voltage is greater than a first threshold voltage;

the microcontroller setting a first voltage diagnostic flag equal to a first fault value if the first number of voltage samples is greater than a first threshold number of voltage samples indicating a voltage out of range high fault condition for the analog-to-digital converter;

the microcontroller sampling the first voltage at the first sampling rate utilizing the first common channel in the second bank of channels to obtain a second predetermined number of voltage samples;

the microcontroller determining a second number of voltage samples in the second predetermined number of voltage samples in which the first voltage is greater than the first threshold voltage; and the microcontroller setting a second voltage diagnostic flag equal to a second first fault value if the second number of voltage samples is greater than the first threshold number of voltage samples indicating the voltage out of range high fault condition for the analog-to-digital converter; and the microcontroller stopping a generation of a control signal to induce the high voltage switch to transition to an open operational position, if the second voltage diagnostic flag is equal to the first fault value, or the second voltage diagnostic flag is equal to the second fault value.

4. The diagnostic system of claim 3, wherein:

the microcontroller initializing the first voltage diagnostic flag to a first initialization value before sampling the first voltage at the first sampling rate utilizing the first common channel in the first bank of channels; and the microcontroller initializing the second voltage diagnostic flag to a second initialization value before sampling the first voltage at the first sampling rate utilizing the first common channel in the second bank of channels.

5. A diagnostic system for a DC-DC voltage converter having a high voltage switch with first and second nodes, and a low voltage switch, a first voltage being applied to the first node, a second voltage being output at the second node, comprising:

a microcontroller having an analog-to-digital converter with a first bank of channels including a first common channel and a first non-common channel;

a first electrical sense line being electrically coupled between and to the first common channel and the first node of the high voltage switch of the DC-DC voltage converter such that the first common channel receives the first voltage;

a second electrical sense line being electrically coupled between and to the first non-common channel and the second node of the high voltage switch of the DC-DC voltage converter such that the first non-common channel receives the second voltage;

the microcontroller sampling the first voltage at a first sampling rate utilizing the first common channel to obtain a first predetermined number of voltage samples;

the microcontroller calculating a first average voltage value corresponding to an average value of the first predetermined number of voltage samples;

the microcontroller sampling the second voltage at the first sampling rate utilizing the first non-common channel to obtain a second predetermined number of voltage samples;

the microcontroller calculating a second average voltage value corresponding to an average value of the second predetermined number of voltage samples;

the microcontroller calculating a first voltage difference value corresponding to an absolute value of a difference between the first and second average voltage values; and the microcontroller stopping a generation of a control signal to induce the low voltage switch to transition to an open operational state if the first voltage difference value is greater than a first threshold voltage difference value.

6. A diagnostic system for a DC-DC voltage converter having a high voltage switch with first and second nodes, and a low voltage switch, a first voltage being applied to the first node, a second voltage being output at the second node, comprising:

a microcontroller having an analog-to-digital converter with a first bank of channels including a first non-common channel and a first common channel, and a second bank of channels including the first common channel;

a first electrical sense line being electrically coupled between and to the first common channel and the first node of the high voltage switch of the DC-DC voltage converter such that the first common channel receives the first voltage;

a second electrical sense line electrically coupled between and to the first non-common channel of the first bank of channels and the second node of the high voltage switch of the DC-DC voltage converter such that the first non-common channel of the first bank of channels receives the second voltage;

the microcontroller sampling the first voltage at a first sampling rate utilizing the first common channel in the second bank of channels to obtain a first predetermined number of voltage samples;

the microcontroller calculating a first average voltage value corresponding to an average value of the first predetermined number of voltage samples;

the microcontroller sampling the second voltage at the first sampling rate utilizing the first non-common channel in the first bank of channels to obtain a second predetermined number of voltage samples;

the microcontroller calculating a second average voltage value corresponding to an average value of the second predetermined number of voltage samples;

the microcontroller calculating a first voltage difference value corresponding to an absolute value of a difference between the first and second average voltage values; and the microcontroller stopping a generation of a control signal to induce the low voltage switch to transition to an open operational state if the first voltage difference value is greater than a first threshold voltage difference value.

7. A diagnostic system for a DC-DC voltage converter having a high voltage switch with first and second nodes, and a low voltage switch, a first voltage being applied to the first node, a second voltage being output at the second node, comprising:

a microcontroller having an analog-to-digital converter with a first bank of channels including first and second common channels and a first non-common channel;

a first electrical sense line being electrically coupled between and to the second common channel and the first node of the high voltage switch of the DC-DC voltage converter such that the second common channel receives the first voltage;

a second electrical sense line electrically coupled between and to the first non-common channel and the second node of the high voltage switch of the DC-DC voltage converter such that the first non-common channel receives the second voltage;

the microcontroller sampling the first voltage at a first sampling rate utilizing the second common channel to obtain a first predetermined number of voltage samples;

the microcontroller calculating a first average voltage value corresponding to an average value of the first predetermined number of voltage samples;

the microcontroller sampling the second voltage at the first sampling rate utilizing the first non-common channel to obtain a second predetermined number of voltage samples;

the microcontroller calculating a second average voltage value corresponding to an average value of the second predetermined number of voltage samples;

the microcontroller calculating a first voltage difference value corresponding to an absolute value of a difference between the first and second average voltage values; and the microcontroller stopping a generation of a control signal to induce the low voltage switch to transition to an open operational state if the first voltage difference value is greater than a first threshold voltage difference value.

8. The diagnostic system of claim 1, wherein the high voltage switch is a high voltage bi-directional MOSFET switch.

9. The diagnostic system of claim 3, wherein the high voltage switch is a high voltage bi-directional MOSFET switch.

10. The diagnostic system of claim 5, wherein the high voltage switch is a high voltage bi-directional MOSFET switch, and the low voltage switch is a low voltage bi-directional MOSFET switch.

11. The diagnostic system of claim 6, wherein the high voltage switch is a high voltage bi-directional MOSFET switch, and the low voltage switch is a low voltage bi-directional MOSFET switch.

12. The diagnostic system of claim 7, wherein the high voltage switch is a high voltage bi-directional MOSFET switch, and the low voltage switch is a low voltage bi-directional MOSFET switch.

* * * * *